(12) United States Patent
Kim et al.

(10) Patent No.: US 12,089,473 B2
(45) Date of Patent: Sep. 10, 2024

(54) DISPLAY DEVICE

(71) Applicant: Samsung Display Co., LTD., Yongin-si (KR)

(72) Inventors: Jae Hong Kim, Suwon-si (KR); Hyang Yul Kim, Hwaseong-si (KR); Hyun Ho Jung, Hwaseong-si (KR); Hee Seong Jeong, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 493 days.

(21) Appl. No.: 17/518,522

(22) Filed: Nov. 3, 2021

(65) Prior Publication Data

US 2022/0231098 A1 Jul. 21, 2022

(30) Foreign Application Priority Data

Jan. 18, 2021 (KR) .................. 10-2021-0006474

(51) Int. Cl.
| | | |
|---|---|---|
| *H10K 59/50* | (2023.01) | |
| *G02B 26/00* | (2006.01) | |
| *G02B 26/02* | (2006.01) | |
| *H10K 59/12* | (2023.01) | |

(52) U.S. Cl.
CPC ........... *H10K 59/50* (2023.02); *G02B 26/004* (2013.01); *G02B 26/02* (2013.01); *H10K 59/12* (2023.02); *G02B 2207/123* (2013.01)

(58) Field of Classification Search
CPC .............. G02F 1/1323; G09G 2358/00; G09G 2320/068; H04N 2013/403; G02B 26/004; G02B 5/24; G02B 26/02; G02B 2207/123; H10K 59/50; H10K 59/12; H10K 50/865; H10K 59/122
See application file for complete search history.

(56) References Cited

U.S. PATENT DOCUMENTS

| | | | |
|---|---|---|---|
| 4,411,495 A * | 10/1983 | Beni | ....................... G02F 1/195 349/91 |
| 10,223,985 B2 | 3/2019 | Staton et al. | |
| 10,288,935 B2 | 5/2019 | Choi et al. | |
| 10,578,895 B2 | 3/2020 | Ikeno | |
| 2014/0232960 A1 | 8/2014 | Schwartz et al. | |
| 2015/0293347 A1* | 10/2015 | Kreit | .................... G02B 26/005 359/290 |
| 2015/0327401 A1* | 11/2015 | Maes | ...................... G09F 19/22 361/699 |
| 2016/0077364 A1* | 3/2016 | Shiota | ................... G02F 1/1341 349/61 |
| 2019/0162990 A1 | 5/2019 | Nishimura et al. | |
| 2019/0162997 A1 | 5/2019 | Asakura et al. | |
| 2019/0163020 A1 | 5/2019 | Ikeno | |

FOREIGN PATENT DOCUMENTS

KR        10-2090077        3/2020

* cited by examiner

*Primary Examiner* — Jonathan Y Jung
(74) *Attorney, Agent, or Firm* — CANTOR COLBURN LLP

(57) ABSTRACT

A display device includes a display panel; and a light path control member disposed on the display panel, wherein the light path control member includes: a housing including a plurality of partition walls and a channel defined between two adjacent partition walls among the plurality of partition walls; a light absorbing solution configured to block transmission of light; and a first fluid transfer portion configured to control flowing of the light absorbing solution into and out of the channel.

20 Claims, 27 Drawing Sheets

DISPLAY DEVICE

CROSS-REFERENCE TO RELATED APPLICATION

This application claims priority from and the benefit of Korean Patent Application No. 10-2021-0006474, filed on Jan. 18, 2021 which is hereby incorporated by reference for all purposes as if fully set forth herein.

BACKGROUND

Field

Embodiments of the invention relate generally to a display device and more specifically, to a display device having a variable view angle mode.

Discussion of the Background

The importance of display devices has steadily increased with the development of multimedia technology. In response thereto, various types of display devices such as an organic light emitting display (OLED), a liquid crystal display (LCD) and the like have been used. Such display devices have been variously applied to various mobile electronic devices, for example, portable electronic devices such as a smart phone, a smart watch, and a tablet PC.

As the demands of users are gradually diversified, in addition to a wide viewing angle mode, a narrow viewing angle mode is also required.

The above information disclosed in this Background section is only for understanding of the background of the inventive concepts, and, therefore, it may contain information that does not constitute prior art.

SUMMARY

Display devices constructed according to the principles of the invention are capable of displaying a narrow viewing angle mode and a wide viewing angle mode according to a user's selection by moving a light absorbing solution through a mechanical force. The display devices include a light path control member configured so that the display devices have the narrow viewing angle mode when the light absorbing solution is injected into the inside of a channel and the display devices have the wide viewing angle mode when the light absorbing solution is discharged to the outside of the channel, and display the narrow viewing angle mode or the wide viewing angle mode according to the user's selection.

Additional features of the inventive concepts will be set forth in the description which follows, and in part will be apparent from the description, or may be learned by practice of the inventive concepts.

According to an aspect of the invention, a display device includes: a display panel; and a light path control member disposed on the display panel, wherein the light path control member includes: a housing including a plurality of partition walls and a channel defined between two adjacent partition walls among the plurality of partition walls; a light absorbing solution configured to block transmission of light; and a first fluid transfer portion configured to control flowing of the light absorbing solution into and out of the channel.

The light path control member may further include a connection portion for providing a fluid connection between the housing and the first fluid transfer portion.

The housing further may include a first accommodating portion disposed between the channel and the connection portion and configured to accommodate at least a part of the light absorbing solution, the first accommodating portion having a fluid connection with the connection portion and the channel.

The display panel may include a display area and a non-display area disposed around the display area, and wherein the display area may overlap the channel.

The housing may further include a first accommodating portion having a fluid connection with the channel and configured to accommodate at least a part of the light absorbing solution, and the non-display area may overlap the first accommodating portion.

A width of each of the plurality of partition walls may be greater than a width of the channel.

The plurality of partition walls may extend in substantially parallel with each other.

The display panel may include a first edge extending in a first direction and a second edge extending in a second direction intersecting the first direction, and the plurality of partition walls may extend in any one of the first direction and the second direction.

The display panel may include a first edge extending in a first direction and a second edge extending in a second direction intersecting the first direction, and the plurality of partition walls may extend in a third direction intersecting the first direction and the second direction.

At least one of the plurality of partition walls may include a plurality of sub-partition walls spaced apart from each other in one direction.

The light path control member may further include a light transmitting fluid which may be not mixed with the light absorbing solution and may be disposed inside the housing.

The light transmitting fluid may include a light transmitting solution, and a difference in refractive index between the light transmitting solution and each of the plurality of partition walls may be about 0.5 or less.

A density of the light transmitting solution may be less than a density of the light absorbing solution.

The housing may further include: a first accommodating portion having a fluid connection with the channel and configured to accommodate at least a part of the light absorbing solution; and a second accommodating portion having a fluid connection with the channel and configured to accommodate at least a part of the light transmitting fluid, and wherein the second accommodating portion may be located on an opposite side of the first accommodating portion with the channel interposed therebetween.

The light path control member may further include a second fluid transfer portion configured to control flowing of the light transmitting fluid into and out of the channel.

The first fluid transfer portion may be configured to control flowing of the light transmitting fluid into and out of the channel.

According to another aspect of the invention, a display device include: a display panel; and a light path control member disposed on the display panel, wherein the light path control member includes: a housing including a plurality of partition walls and a channel defined between adjacent partition walls among the plurality of partition walls; and a light absorbing solution configured to block transmission of light, and wherein the light path control member is configured to charge the light absorbing solution into the channel in a first mode and discharge the light absorbing solution to an outside of the channel in a second mode different from the first mode.

In the first mode, the light absorbing solution filled in the channel may overlap a display area of the display panel, and in the second mode, the light absorbing solution may not overlap the display area of the display panel.

The light path control member may further include a light transmitting fluid, and the light path control member may be configured to charge the light transmitting fluid into the channel in the second mode and discharge the light transmitting fluid to the outside of the channel in the first mode.

The light path control member may further include a fluid transfer portion configured to control flowing of the light absorbing solution into and out of the channel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
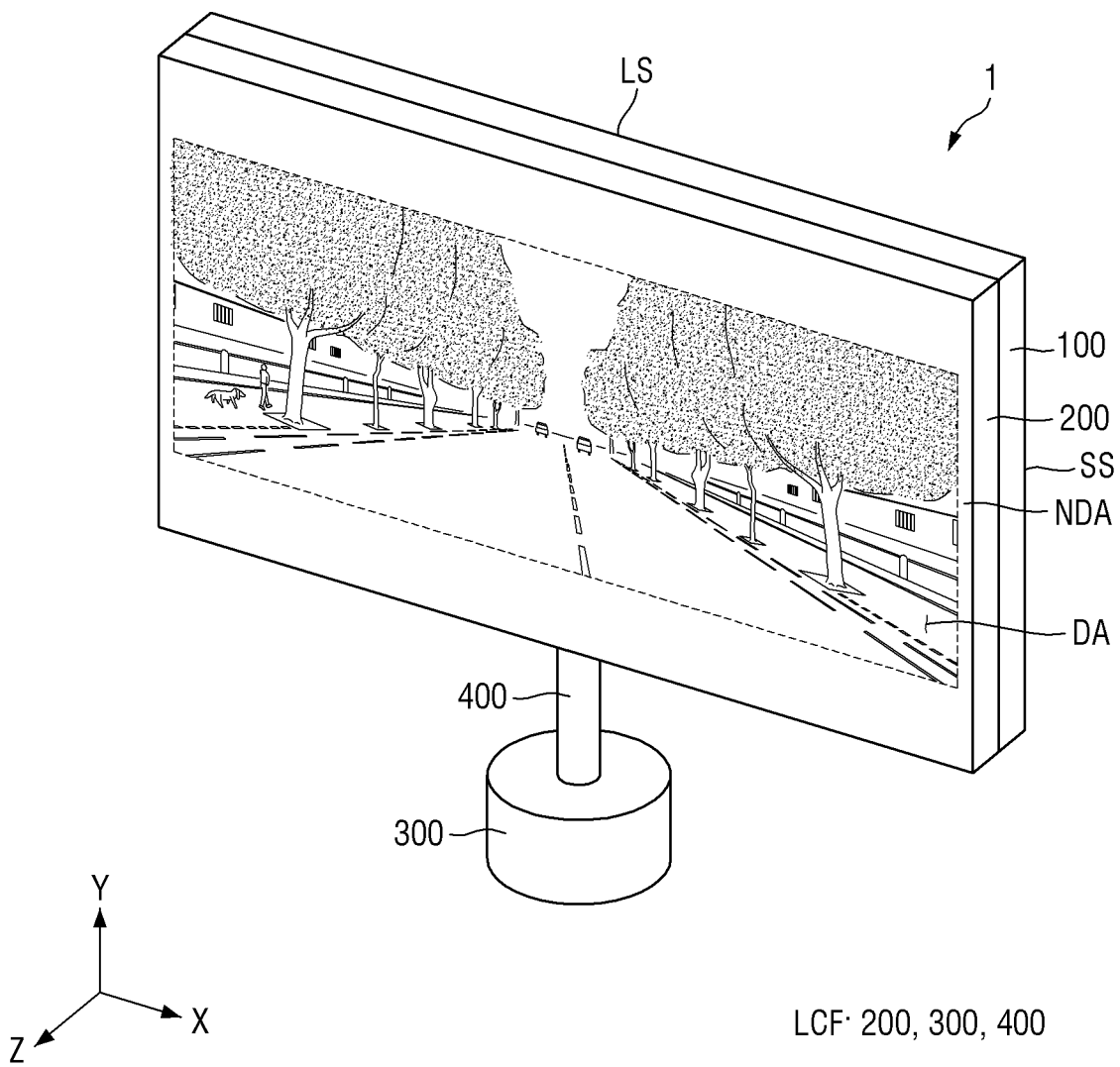
FIG. 1 is a perspective view of an embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z-axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
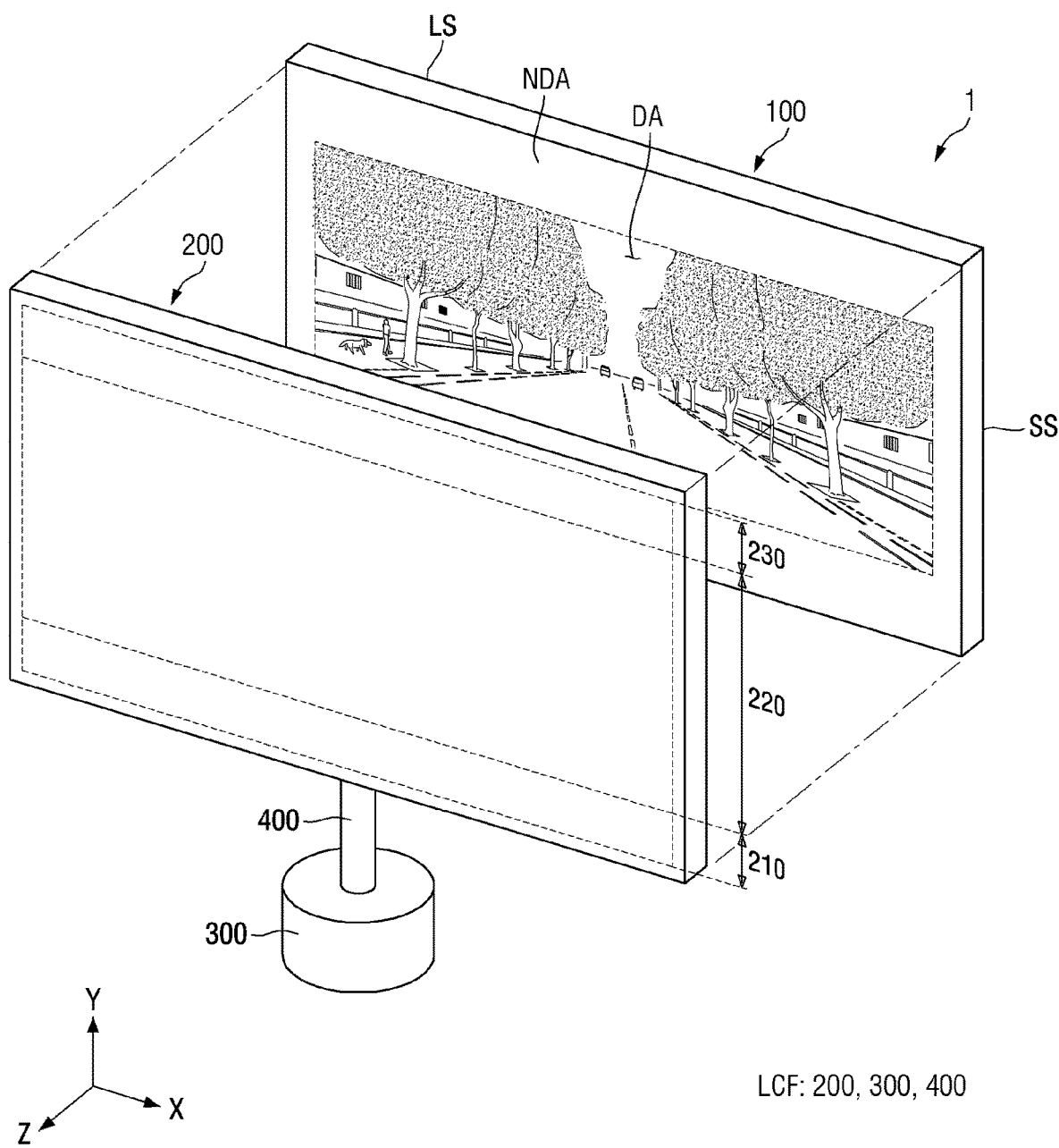
FIG. 2 is an exploded perspective view of the display device of FIG. 1.
Figure 3:
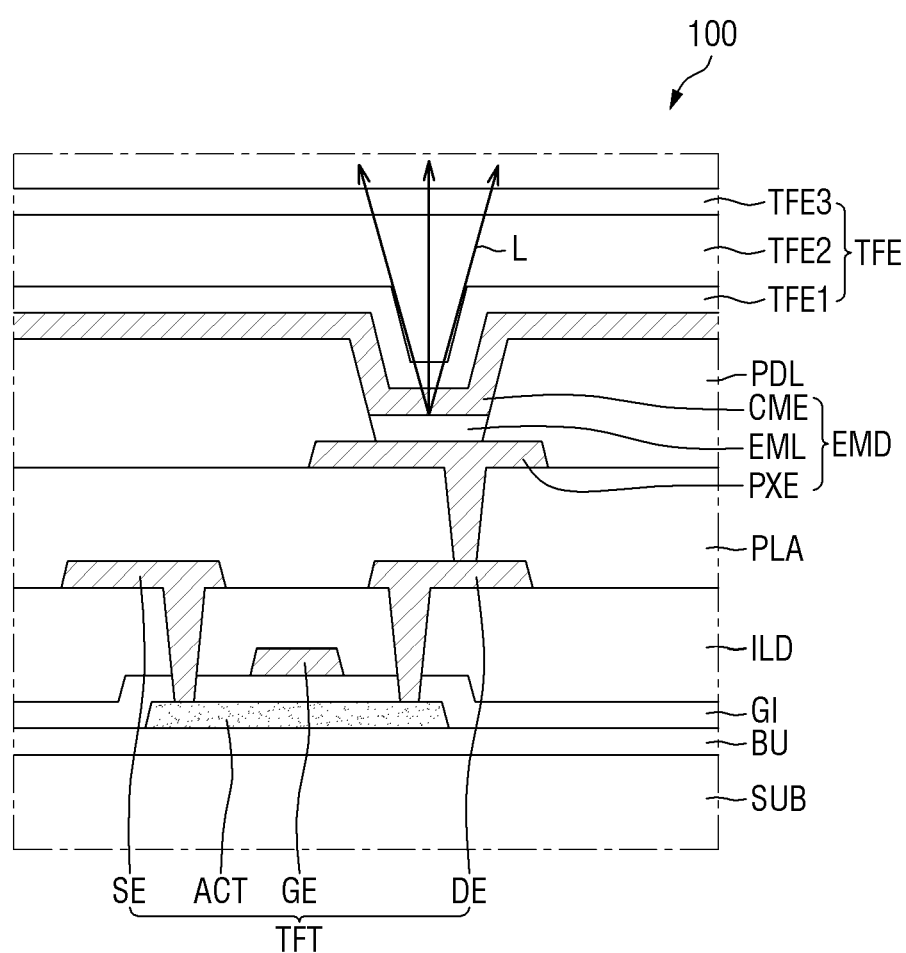
FIG. 3 is a cross-sectional view of a display panel of the display device of FIG. 2.
Figure 4:
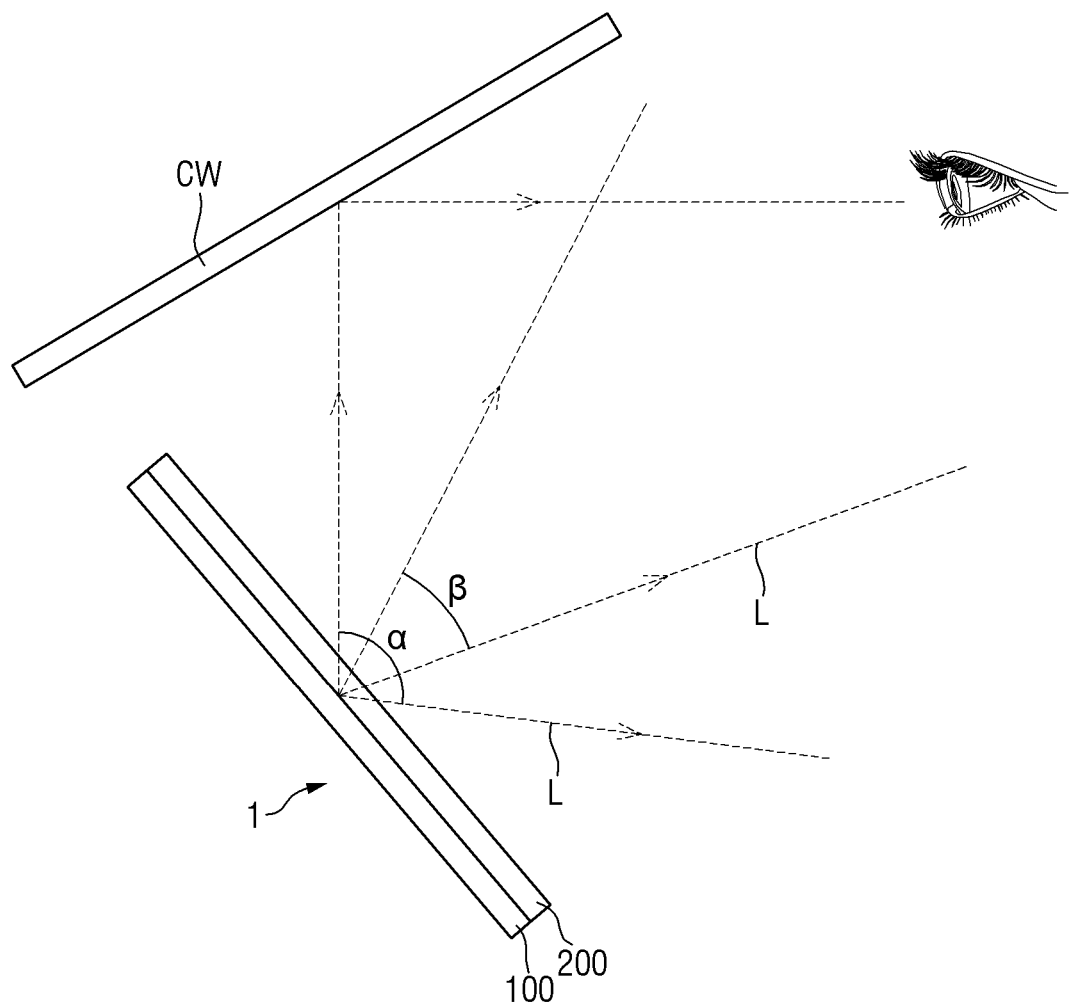
FIG. 4 is a schematic diagram illustrating a situation in which a user views the display device of FIG. 2 from a position having a predetermined viewing angle.

FIG. 1 is a perspective view of a display device according to an embodiment. FIG. 2 is an exploded perspective view of a display device according to an embodiment. FIG. 3 is an exemplary cross-sectional view of a display panel according to an embodiment. FIG. 4 is a schematic diagram illustrating a situation in which a user views a display device according to an embodiment from a position having a predetermined viewing angle.

Referring to FIGS. 1, 2, 3, and 4, a display device 1 is a device for displaying a moving image or a still image. The display device 1 may be used as a display screen of various devices, such as a television, a laptop computer, a monitor, a billboard and an Internet-of-Things (JOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 1 according to an embodiment includes a display panel 100 for displaying an image and a light path control member LCF that is disposed on the display panel 100 and capable of adjusting a viewing angle of the display device 1.

The display panel 100 may include a display area DA and a non-display area NDA. The display area DA is an area where an image can be displayed, and the non-display area NDA is an area where an image is not displayed. The display area DA may also be referred to as an active region, and the non-display area NDA may also be referred to as a non-active region. The display area DA may be disposed at the center of the display device 1 to occupy most of the front surface of the display device 1.

The non-display area NDA may be disposed around the display area DA. The non-display area NDA may completely or partially surround the display area DA. The display area DA may have a rectangular shape, and the non-display area NDA may be disposed adjacent to four sides of the display area DA. The non-display area NDA may form a bezel of the display device 1. Wires or circuit drivers included in the display device 1 may be disposed in the non-display area NDA, or external devices may be mounted thereon.

The planar shape of the display panel 100 may be variously modified. For example, the display device 1 may have a shape such as a rectangular shape elongated in a horizontal direction, a rectangular shape elongated in a vertical direction, a square shape, a quadrilateral shape with rounded corners (e.g., vertices), other polygonal shapes and a circular shape. In an embodiment, the display panel 100 may include a first edge LS extending in a first direction X and a second edge SS extending in a second direction Y intersecting the first direction X. For example, the first edge LS of the display panel 100 may be a long side, and the second edge SS may be a short side shorter than the first edge LS. However, embodiments are not limited thereto. The shape of the display area DA of the display panel 100 may also be similar to the overall planar shape of the display panel 100.

Examples of the display panel 100 may include an inorganic light emitting diode display panel, an organic light emitting diode display panel, a quantum dot light emitting display panel, a plasma display panel, a field emission display panel, or the like. In the following description, a case where an organic light emitting diode display panel is applied as an example of the display panel 100 will be exemplified, but embodiments are not limited thereto, and other display panels may be applied to various technical areas and fields.

Hereinafter, a detailed stacked structure of the display area DA of the display panel 100 according to an embodiment will be briefly described.

The display panel 100 may include a substrate SUB and various conductive layers and insulating layers disposed on the substrate SUB.

The substrate SUB may be an insulating substrate. The substrate SUB may support various conductive layers and insulating layers to be described later.

A buffer layer BU may be disposed on the substrate SUB. The buffer layer BU can prevent diffusion of impurity ions, prevent penetration of moisture or external air, and perform a surface planarization function.

The semiconductor layer ACT may be disposed on the buffer layer BU. The semiconductor layer ACT may include monocrystalline silicon, low temperature polycrystalline silicon, amorphous silicon, or the like.

A gate insulating layer GI may be disposed on the semiconductor layer ACT. The gate insulating layer GI may be made of an inorganic material.

A gate electrode GE may be disposed on the gate insulating layer GI. The gate electrode GE may be connected to a gate wire to receive a gate signal.

An interlayer insulating layer ILD may be disposed on the gate electrode GE. The interlayer insulating layer ILD may be disposed over the gate electrode GE and the gate insulating layer GI. The interlayer insulating layer ILD may be formed of an organic material or an inorganic material, and may be a single layer or a multilayer stack of different materials.

A source electrode SE and a drain electrode DE may be disposed on the interlayer insulating layer ILD. Each of the source electrode SE and the drain electrode DE may penetrate the interlayer insulating layer ILD and the gate insulating layer GI, and may be electrically connected to the semiconductor layer ACT. The source electrode SE may be connected to a data wire to receive a data signal.

The semiconductor layer ACT, the gate electrode GE, the source electrode SE, and the drain electrode DE may form a thin film transistor TFT, which is a switching element.

A planarization layer PLA may be disposed on the source electrode SE and the drain electrode DE. In some embodiments, the planarization layer PLA may be formed of an organic material, but embodiments are not limited thereto.

A pixel electrode PXE may be disposed on the planarization layer PLA. The pixel electrode PXE may penetrate the planarization layer PLA to be connected to the drain electrode DE. In some embodiments, the pixel electrode PXE may be an anode electrode.

A pixel defining layer PDL partially exposing the pixel electrode PXE may be disposed on the planarization layer PLA. In some embodiments, the pixel defining layer PDL may be formed of an organic material.

A light emitting layer EML for emitting light L may be disposed on the pixel electrode PXE exposed by the pixel defining layer PDL. For example, the light emitting layer EML may be a multilayer further including one or more of a hole injection layer (HIL), a hole transporting layer (HTL), an electron transporting layer (ETL), and an electron injection layer (EIL).

A common electrode CME may be disposed on the light emitting layer EML and the pixel defining layer PDL. In some embodiments, the common electrode CME may be a cathode electrode.

The pixel electrode PXE, the light emitting layer EML, and the common electrode CME may form a light emitting element EMD.

A thin film encapsulation layer TFEL may be disposed on the light emitting element EMD. The thin film encapsulation layer TFEL may seal the light emitting element EMD and prevent moisture or the like from permeating or penetrating into the light emitting element EMD from the outside. In some embodiments, the thin film encapsulation layer TFEL may entirely cover the display area DA.

The thin film encapsulation layer TFEL may include one or more organic layers and one or more inorganic layers. For example, the thin film encapsulation layer TFEL may include a first inorganic layer TFE1 disposed on the common electrode CME, an organic layer TFE2 disposed on the first inorganic layer TFE1, and a second inorganic layer TFE3 disposed on the organic layer TFE2.

The first inorganic layer TFE1 may prevent moisture, oxygen, or the like from permeating or penetrating into the light emitting element EMD.

The organic layer TFE2 may improve the flatness of the thin film encapsulation layer TFEL. The organic layer TFE2 may be formed of a liquid organic material.

The second inorganic layer TFE3 may perform a role substantially the same as or similar to the first inorganic layer TFE1, and may be formed of a material substantially the same or similar to the first inorganic layer TFE1. The second inorganic layer TFE3 may completely cover the organic layer TFE2.

The display device 1 according to an embodiment may display an image at a viewing angle of a predetermined first angle α with respect to a direction perpendicular to the display surface. For example, the display device 1 may emit light within the range of the first angle α with respect to a direction perpendicular to the display surface, and a user positioned within the range of the first angle α may visually recognize the image displayed on the display device 1. For example, the range of the first angle α may be about 150° or more, about 160° or more, or about 170° or more.

In some cases, the display device 1 needs to have a narrow viewing angle. When the display device 1 according to an embodiment is applied to a vehicle monitor, for example, light emitted from the display device 1 at the first angle α as a viewing angle may be reflected on a vehicle windshield CW and visually recognized by the driver. In particular, the light L emitted from the display device 1 and reflected on the vehicle windshield CW during driving at night may interfere with the driver's view, thereby causing a risk of a vehicle accident. Accordingly, the display device 1 needs to emit light L at a narrow viewing angle according to a user's selection. Moreover, in order to protect the user's personal privacy, the display device 1 needs to emit light L at a narrow viewing angle so that the image is not visually recognized by other people positioned around the user.

The display device 1 according to an embodiment may display an image at a viewing angle of a second angle β smaller than the first angle α. For example, the display device 1 may emit light within the range of a second angle β that is smaller than the first angle α with respect to a direction perpendicular to the display surface, and a user positioned within the range of the second angle β may visually recognize an image displayed on the display device 1. For example, the range of the second angle may be about 90° or less, about 80° or less, about 70° or less, or about 60° or less.

As described above, in order to variously adjust the viewing angle of the display device 1 to the first viewing angle α or the second angle β, or the like, the light path control member LCF may be required.

The light path control member LCF may be disposed on the display panel 100. The light path control member LCF may control a path of light emitted from the display panel 100. Specifically, the light path control member LCF may control the viewing angle of the display device 1.

The light path control member LCF may be disposed on the front surface which is the display surface of the display panel 100. For example, light emitted from the display panel 100 may pass through the light path control member LCF and exit to the outside.

The light path control member LCF may include a housing 200, a fluid transfer portion 300 disposed outside the housing 200, and a connection portion 400 connecting the housing 200 and the fluid transfer portion 300. As will be described later, the light path control member LCF may further include a light absorbing solution (see 'SL1' in FIG. 5) disposed inside at least one of the housing 200, the fluid transfer portion 300, and the connection portion 400. In the light path control member LCF, the housing 200 may be disposed to overlap the display panel 100.

A detailed description of the light path control member LCF will be described later with reference to FIGS. 5 to 13. Specifically, the description of the light path control member LCF will first describe a wide viewing angle mode, in which the light path control member LCF does not affect the path of light emitted from the display panel 100 with reference to FIGS. 5 to 9, and will describe a narrow viewing angle mode, in which the light path control member LCF limits the path of light emitted from the display panel 100 with reference to FIGS. 10 to 13.

Figure 5:
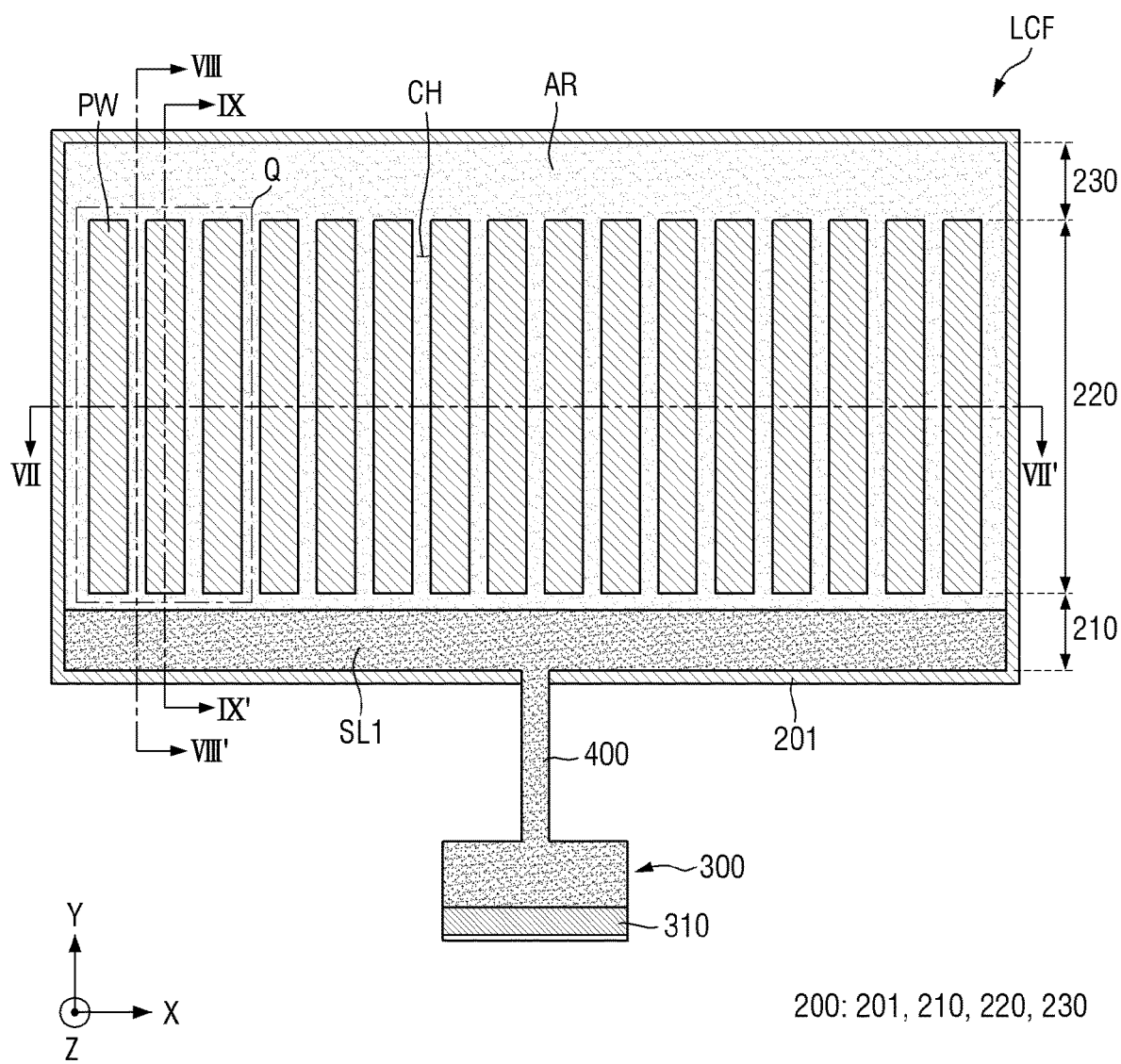
FIG. 5 is a schematic diagram of an embodiment of a light path control member of the display device of FIG. 2 in a wide view angle mode.
Figure 6:
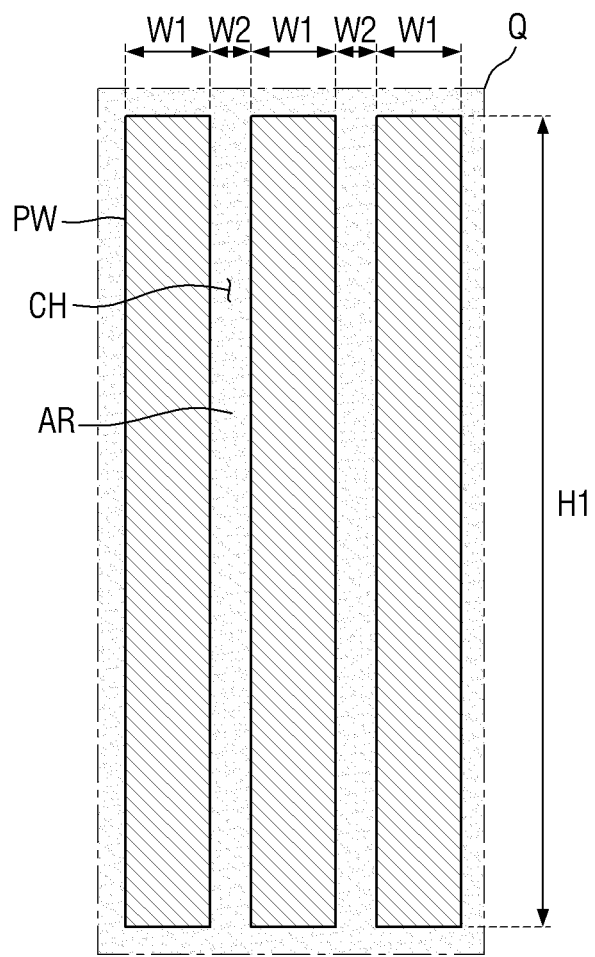
FIG. 6 is an enlarged view of area Q of FIG. 5.
Figure 7:
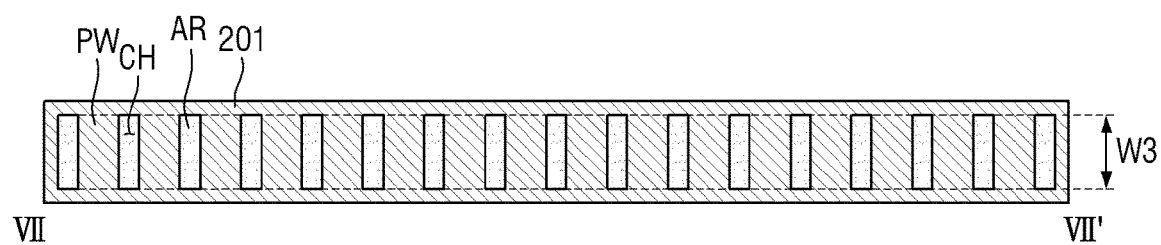
FIG. 7 is a cross-sectional view taken along line VII-VII' of FIG. 5.
Figure 7:
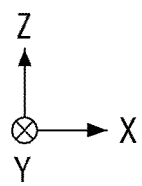
Figure 8:
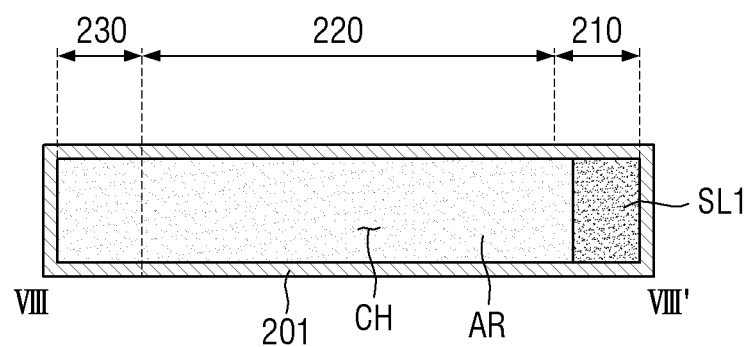
FIG. 8 is a cross-sectional view taken along line VIII-VIII' of FIG. 5.
Figure 8:
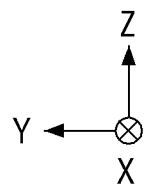
Figure 9:
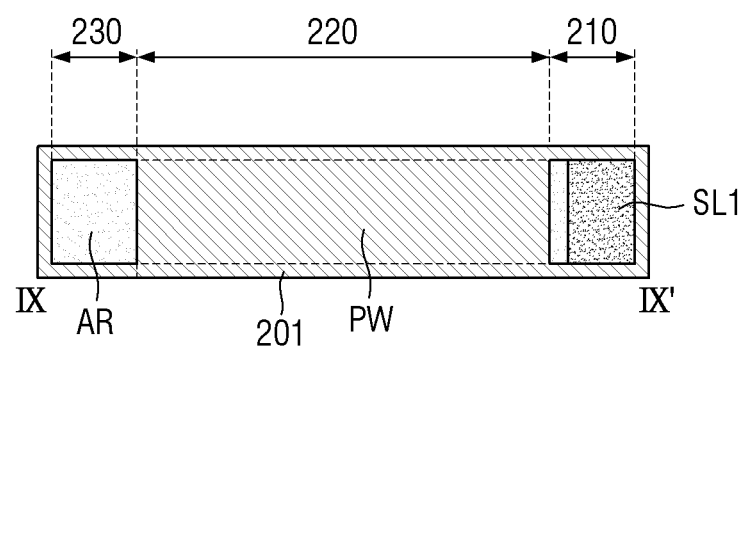
FIG. 9 is a cross-sectional view taken along line IX-IX' of FIG. 5.

FIG. 5 is a schematic diagram of a light path control member according to an embodiment. FIG. 6 is an enlarged view of area Q of FIG. 5. FIG. 7 is a cross-sectional view taken along line VII-VII' of FIG. 5. FIG. 8 is a cross-sectional view taken along line VIII-VIII' of FIG. 5. FIG. 9 is a cross-sectional view taken along line IX-IX' of FIG. 5.

Referring to FIGS. 5 to 9, the light path control member LCF according to an embodiment may include the housing 200, the fluid transfer portion 300 disposed outside the housing 200, and the connection portion 400 connecting the housing 200 and the fluid transfer portion 300.

The housing 200 may provide a space filled with the light absorbing solution SL1 so that the light absorbing solution SL1, which will described later, forms a louver (refer to 'LV' in FIG. 10) for controlling the light path. The louver may be a light blocking member that prevents the light L from proceeding so that the light L proceeds only in a specific direction.

The housing 200 according to an embodiment may include a housing cover 201 and a plurality of partition walls PW disposed inside the housing cover 201. The housing 200 may have a film shape.

The planar shape of the housing cover 201 may be substantially the same as the planar shape of the display panel (refer to '100' in FIG. 1) on which the housing 200 overlaps. The housing cover 201 may be formed of a flexible polymer material, but embodiments are not limited thereto. For example, the housing cover 201 may be formed of a rigid material. For example, the housing cover 201 may include at least one selected from the group consisting of polyethylene terephthalate (PET), polyethylene naphthalate (PEN), polycarbonate (PC), polymethyl methacrylate (PMMA), polystyrene (PS), polyvinylchloride (PVC), polyethersulfone (PES), polyethylene (PE), polypropylene (PP), polyimide (PI), and glass, but embodiments are not limited thereto.

Each of the plurality of partition walls PW may extend in the second direction Y. The plurality of partition walls PW may be arranged along the first direction X. In an embodiment, a length of each partition wall PW in the first direction X and a length of each partition wall PW in the second direction Y may be substantially constant or uniform for each area. For example, each partition wall PW may have a first width W1 in the first direction X and a first length H1 in the second direction Y. The first width W1, which is a length of each partition wall PW in the first direction X, may be about 30 μm to about 100 μm, and the first length H1, which is a length of each partition wall PW in the second direction Y, may be substantially the same as the length in the second direction Y of the display area DA of the display panel 100 on which the light path control member LCF is disposed.

The adjacent partition walls PW among the plurality of partition walls PW may be disposed to be spaced apart from each other. A separation distance between the adjacent partition walls PW among the plurality of partition walls PW may have a second width W2 smaller than the first width W1. The second width W2 may be about 5 μm to 50 μm. As will be described later, the second width W2 may be substantially the same as the width of a channel CH in the first direction X.

The housing 200 may include the channels CH defined between the adjacent partition walls PW among the plurality of partition walls PW and the housing cover 201, and between each partition wall PW disposed at the outermost side on the one side and the other side of the first direction X among the plurality of partition walls PW, and the housing cover 201. Accordingly, there are a plurality of channels CH, and the plurality of channels CH may be disposed to be spaced apart along the first direction X. In addition, the width of each channel CH in the first direction X may be substantially the same as the second width W2, which is a separation distance between the adjacent partition walls PW among the plurality of partition walls PW, and the separation distance between the channels CH disposed adjacent to each other among the plurality of channels CH may have the first width W1 that is a length of each partition wall PW in the first direction X.

In addition, each channel CH may have a third width W3 in the third direction Z. The third width W3 may be about 50

μm to about 100 μm, but embodiments are not limited thereto. The first width W1 and the third width W3 may have substantially the same value. As described above, the second width W2, which is the width of each channel CH in the first direction X, may be about 5 μm to 50 μm. When the width of each channel CH in the first direction X is about 5 μm or more, the light L emitted from the display panel 100 reaches the user's naked eye in a sufficient amount so that the user may visually recognize a stable image, and when it is about 50 μm or less, it is possible to secure a narrow viewing angle so that only a user who watches the display device 1 from the front surface may visually recognize the light L emitted from the display panel 100.

The channels CH may extend in the second direction Y. In the wide viewing angle mode, the channels CH may be filled with a transparent fluid. For example, in the wide viewing angle mode, the channels CH may be filled with a transparent colorless gas such as air or an inert gas. As will be described later, the channels CH may be filled with the light absorbing solution SL1 in the narrow viewing angle mode to form the louver LV.

The interior of the housing 200 may include a louver portion 220 in which the partition wall PW is disposed, a first fluid accommodating portion 210 disposed on a first side (e.g., the right side) of the louver portion 220, and a second fluid accommodating portion 230 disposed on a second side (e.g., the left side) of the louver portion 220. The first side and the second side of the louver portion 220 may face each other in the second direction Y.

The partition walls PW and the channels CH may be disposed in the louver portion 220 as described above. The louver portion 220 may overlap the display area DA of the display panel 100 that overlaps the housing 200. Specifically, the partition walls PW and the channels CH may overlap the display area DA of the display panel 100. The edge of the display area DA may be disposed inside the louver portion 220. The first fluid accommodating portion 210 may be disposed on the other side of the second direction Y of the partition walls PW, and may be spatially connected to the channels CH and the connection portion 400 to be described later. In the description, being spatially connected means a fluid connection that substances such as fluids positioned therein may move or interchange therebetween. In other words, the material positioned in the first fluid accommodating portion 210 may move to the channels CH and the connection portion 400, and conversely, the material positioned in the channels CH and the connection portion 400 may move to the first fluid accommodating portion 210. The first fluid accommodating portion 210 may accommodate at least a part of the light absorbing solution SL1.

FIGS. 5 to 9 illustrate that the light absorbing solution SL1 is partially disposed in the first fluid accommodating portion 210 in the wide viewing angle mode, but embodiments are not limited thereto, and the light absorbing solution SL1 may not be disposed in the first fluid accommodating portion 210 in the wide viewing angle mode. The second fluid accommodating portion 230 may be disposed on one side of the partition wall PW in the second direction Y and may be spatially connected to the channels CH. In other words, the second fluid accommodating portion 230 may be positioned on the opposite side of the first fluid accommodating portion 210 with the channels CH interposed therebetween. For example, the second fluid accommodating portion 230 may be in a fluid connection with the channels CH. In addition, a material positioned in the second fluid accommodating portion 230 and a material positioned in the channels CH may move or interchange therebetween. The second fluid accommodating portion 230 may accommodate at least a part of gas AR.

In the wide viewing angle mode, the channels CH and the second fluid accommodating portion 230 inside the housing 200 may be filled with the gas AR. Moreover, an area of the first fluid accommodating portion 210 in which the light absorbing solution SL1 is not disposed may also be filled with the gas AR. Here, the gas AR may be colorless air or an inert gas.

A fluid transfer portion 300 capable of moving a fluid may be disposed outside the housing 200. The fluid transfer portion 300 may operate in a first mode for influxing or charging the light absorbing solution SL1 into the channels CH and a second mode for outfluxing or discharging the light absorbing solution SL1 to the outside of the channels CH. The first mode may be a process in which the light path control member LCF is switched from the wide viewing angle mode to the narrow viewing angle mode, and the second mode may be a process in which the light path control member LCF is switched from the narrow viewing angle mode to the wide viewing angle mode. Specifically, the fluid transfer portion 300 may be a pump that provides a positive pressure to the light absorbing solution SL1 to influx or charge the light absorbing solution SL1 into the channels CH or that provides a negative pressure to the light absorbing solution SL1 to outflux or discharge the light absorbing solution SL1 to the outside from the channels CH. In the wide viewing angle mode, a part of the light absorbing solution SL1 may be disposed inside the fluid transfer portion 300, but embodiments are not limited thereto. In the description, for descriptive convenience, the fluid transfer portion 300 including a piston 310 is illustrated, but embodiments are not limited thereto. For example, the fluid transfer portion 300 may have a different structure.

The connection portion 400 may be disposed between the housing 200 and the fluid transfer portion 300. The connection portion 400 may be a pipe spatially connecting the inner space of the housing 200 to the fluid transfer portion 300. For example, the connection portion 400 may be used for a fluid connection between the housing 200 and the fluid transfer portion 300. For example, a material positioned inside the housing 200 and a material positioned in the fluid transfer portion 300 may move or interchange therebetween.

Specifically, the connection portion 400 may spatially connect the fluid transfer portion 300 to the first fluid accommodating portion 210 of the housing 200. For example, the connection portion 400 may be used for a fluid connection between the fluid transfer portion 300 and the first fluid accommodating portion 210 of the housing 200. A part of the light absorbing solution SL1 may be disposed inside the connection portion 400, but embodiments are not limited thereto. The connection portion 400 may be, for example, a pipe having one side (e.g., one opening) connected to the first fluid accommodating portion 210 and the other side (e.g., the other opening) connected to the fluid transfer portion 300. The connection portion 400 may be formed of substantially the same material as that of the housing cover 201, but embodiments are not limited thereto, and may be formed of a material different from that of the housing cover 201. When the fluid transfer portion 300 provides a positive pressure to the light absorbing solution SL1, the light absorbing solution SL1 moves from the connection portion 400 toward the first fluid accommodating portion 210, and when the fluid transfer portion 300 provides a negative pressure to the light absorbing solution SL1, the light absorbing solution SL1 may move from the connection portion 400 to the fluid transfer portion 300.

The light absorbing solution SL1 may be disposed inside at least one of the housing 200, the fluid transfer portion 300, or the connection portion 400. The light absorbing solution SL1 may block transmission of the light L. In other words, the light L entering the light absorbing solution SL1 may be blocked from proceeding by the light absorbing solution SL1. Accordingly, the light absorbing solution SL1 filled in the channels CH may function as the louver LV. The light absorbing solution SL1 may include, for example, a solution in which at least one of graphite, black pigment, black dye, black die, or carbon black is dispersed.

Hereinafter, a narrow viewing angle mode will be described with reference to FIGS. 10 to 13. In the following description, contents overlapping those described above with reference to FIGS. 5 to 9 will be omitted for descriptive convenience.

Figure 10:
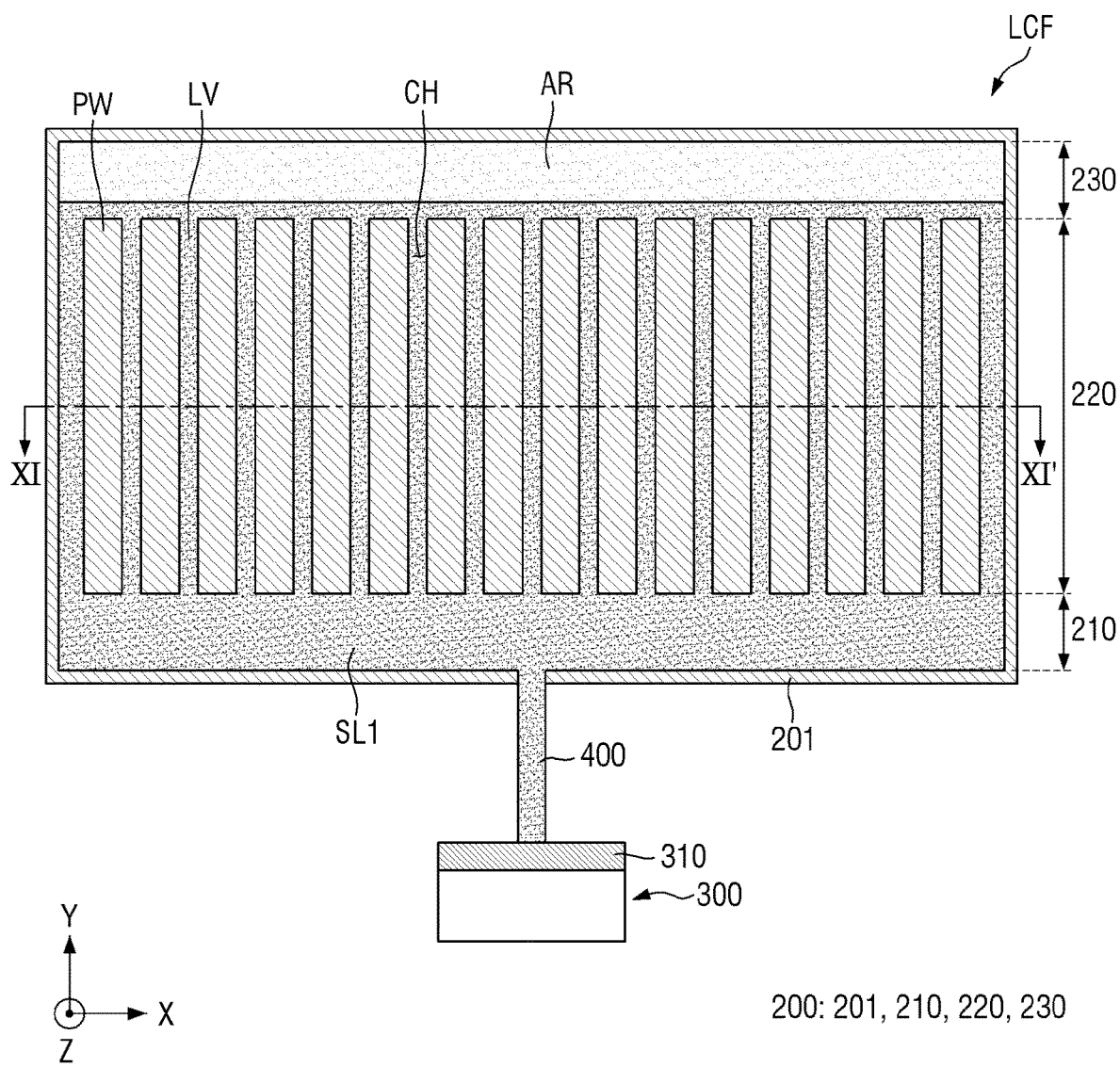
FIG. 10 is a schematic diagram illustrating a narrow view angle mode of the light path control member of FIG. 5.
Figure 11:
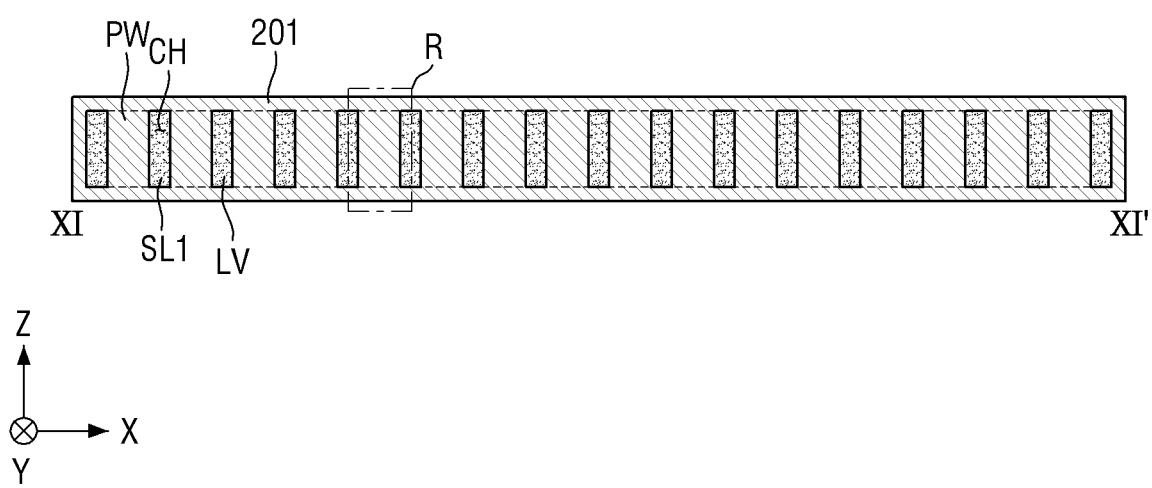
FIG. 11 is a cross-sectional view taken along line XI-XI' of FIG. 10.
Figure 12:
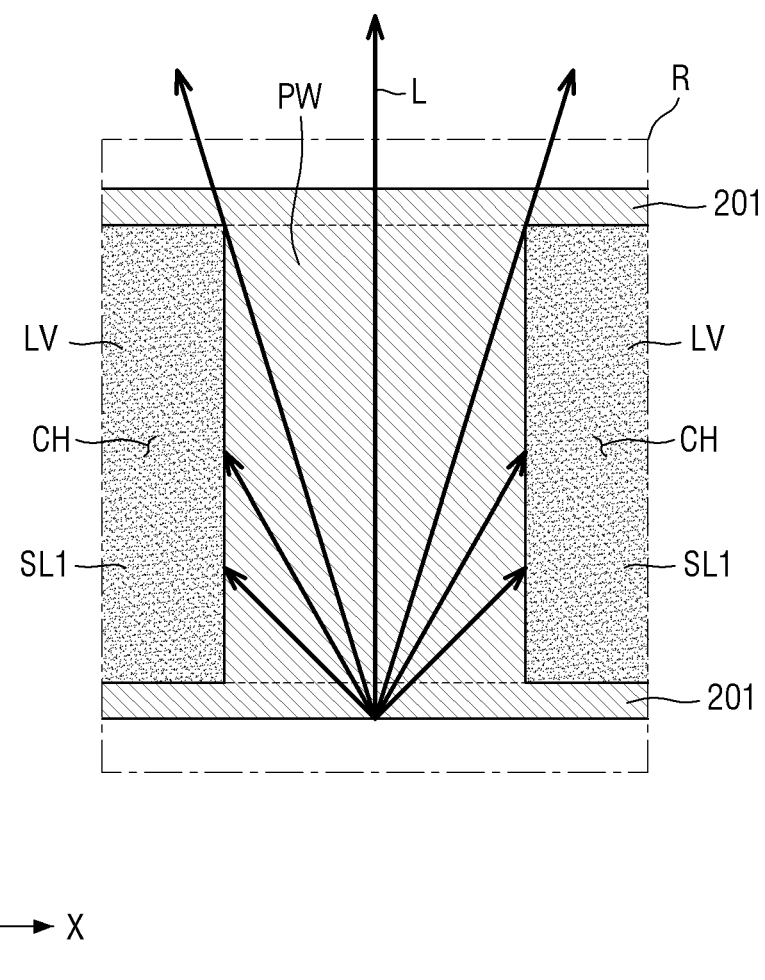
FIGS. 12 and 13 are schematic views illustrating that light passes through area R of FIG. 11.
Figure 13:
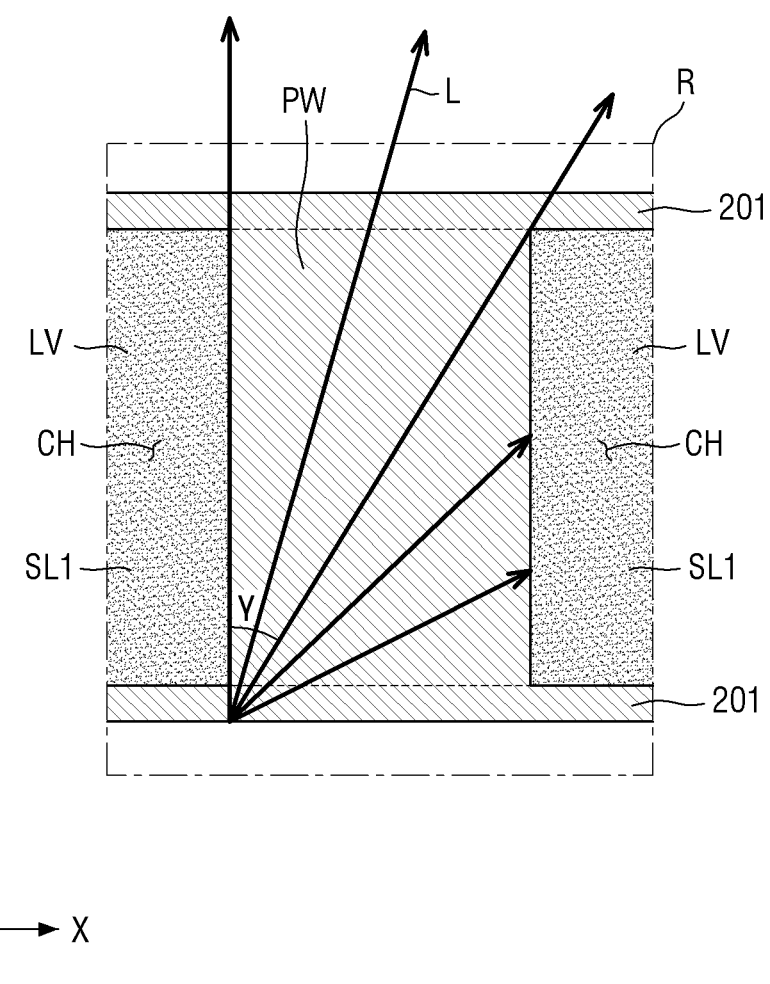

FIG. 10 is a schematic diagram illustrating a modified example of a light path control member according to an embodiment. FIG. 11 is a cross-sectional view taken along line XI-XI' of FIG. 10. FIGS. 12 and 13 are schematic views illustrating that light passes through area R of FIG. 11.

In FIGS. 12 and 13, the starting point of the light L, at which the light L starts to be emitted, is illustrated as the other side of the third direction Z of the housing cover 201 for descriptive convenience, but embodiments are not limited thereto, and the starting point of the light L, at which the light L starts to be emitted, may be positioned inside the display panel 100 in which the light path control member LCF is disposed.

Referring to FIGS. 10 to 13, in the light path control member LCF according to an embodiment, the light path control member LCF may form the louver LV using the light absorbing solution SL1 in the narrow viewing angle mode. Specifically, the louver LV may be referred to as the light absorbing solution SL1 filled in the channels CH. In the narrow viewing angle mode, the fluid transfer portion 300 may apply a positive pressure to the light absorbing solution SL1 to completely fill the channels CH with the light absorbing solution SL1. In the narrow viewing angle mode, the light absorbing solution SL1 may completely fill the first fluid accommodating portion 210 and the louver portion 220, and may partially fill the second fluid accommodating portion 230. As described above, the light absorbing solution SL1 filling the channels CH of the louver portion 220 may be defined by the louver LV.

The louver LV may block the path of the light L. Specifically, in the narrow viewing angle mode, the louver LV may partially block a path of the light L emitted from the display panel 100 to limit an area in which the light L is visually recognized. For example, the louver LV may limit or decrease the viewing angle of the display device 1. The light L entering the louver LV from the other side of the third direction Z of the housing 200 may be emitted to an area inclined by a maximum third angle γ from a direction perpendicular to the front surface of the housing 200. The third angle γ may be substantially equal to half of the second angle described above.

When the light absorbing solution SL1 fills the channels CH to form the louver LV in the narrow viewing angle mode, the volume of the gas AR may decrease. The gas AR may partially fill the second fluid accommodating portion 230. In addition, the internal pressure of the gas AR may increase due to the limited space inside the housing 200. In other words, the pressure applied by the gas AR toward the light absorbing solution SL1 and the housing cover 201 may increase.

The display device 1 according to an embodiment may include the light path control member LCF having a wide viewing angle mode because the light absorbing solution SL1 is disposed outside the channels CH and a narrow viewing angle mode because the light absorbing solution SL1 is disposed inside the channels CH, so that the viewing angle may be freely adjusted or changed according to the user's selection.

In addition, the light path control member LCF may be driven through the fluid transfer portion 300 using a mechanical force, so that it is possible to easily implement the viewing angle adjustment.

Hereinafter, another embodiment of the light path control member LCF will be described. In the description of the light path control member LFC according to another embodiment to be described later, the overlapping description of the light path control member LFC according to an embodiment will be omitted for descriptive convenience, and the following description will be focused on the differences therebetween.

Figure 14:
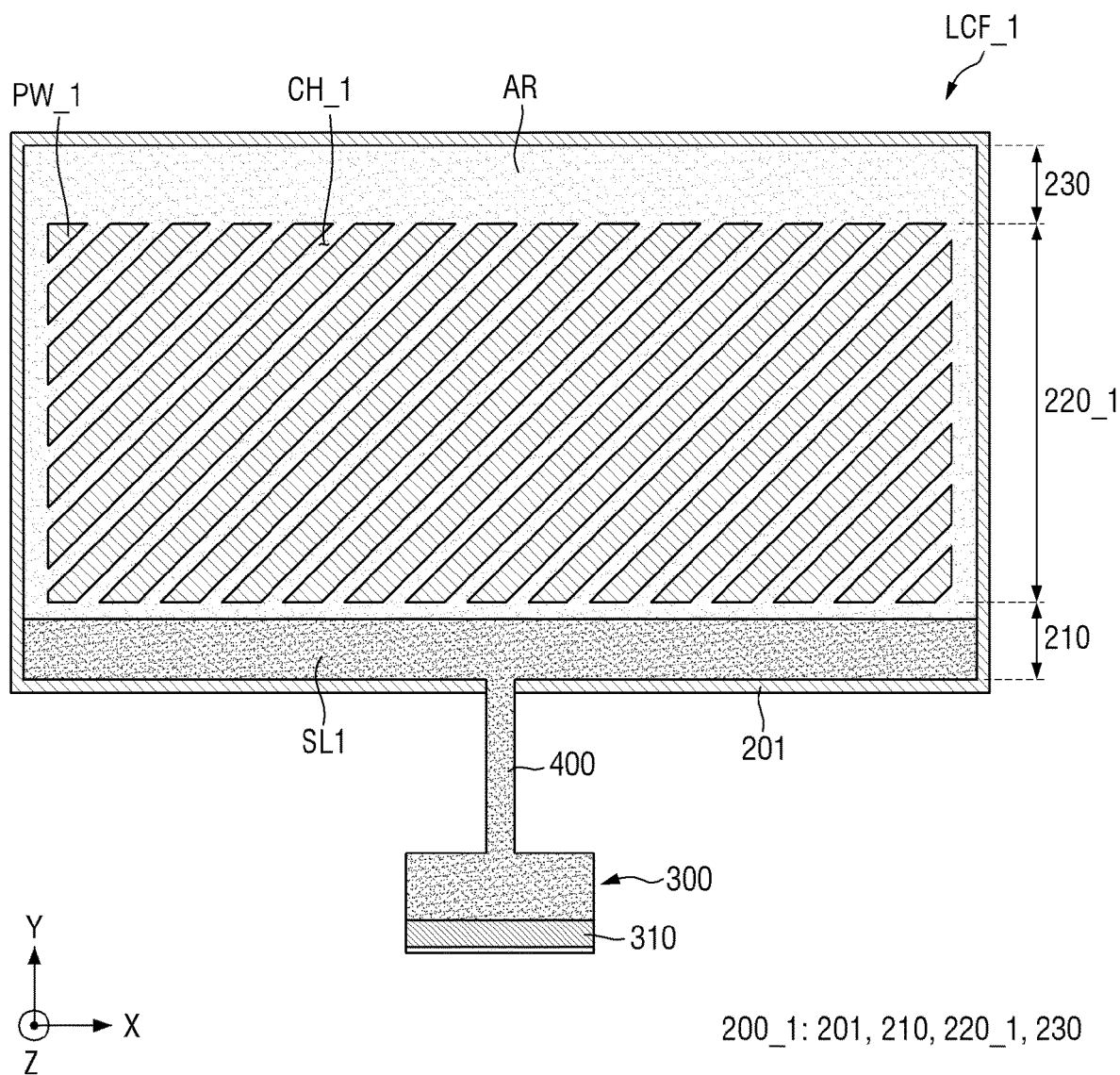
FIG. 14 is a schematic diagram of another embodiment of the light path control member of the display device of FIG. 2 in a wide view angle mode.
Figure 15:
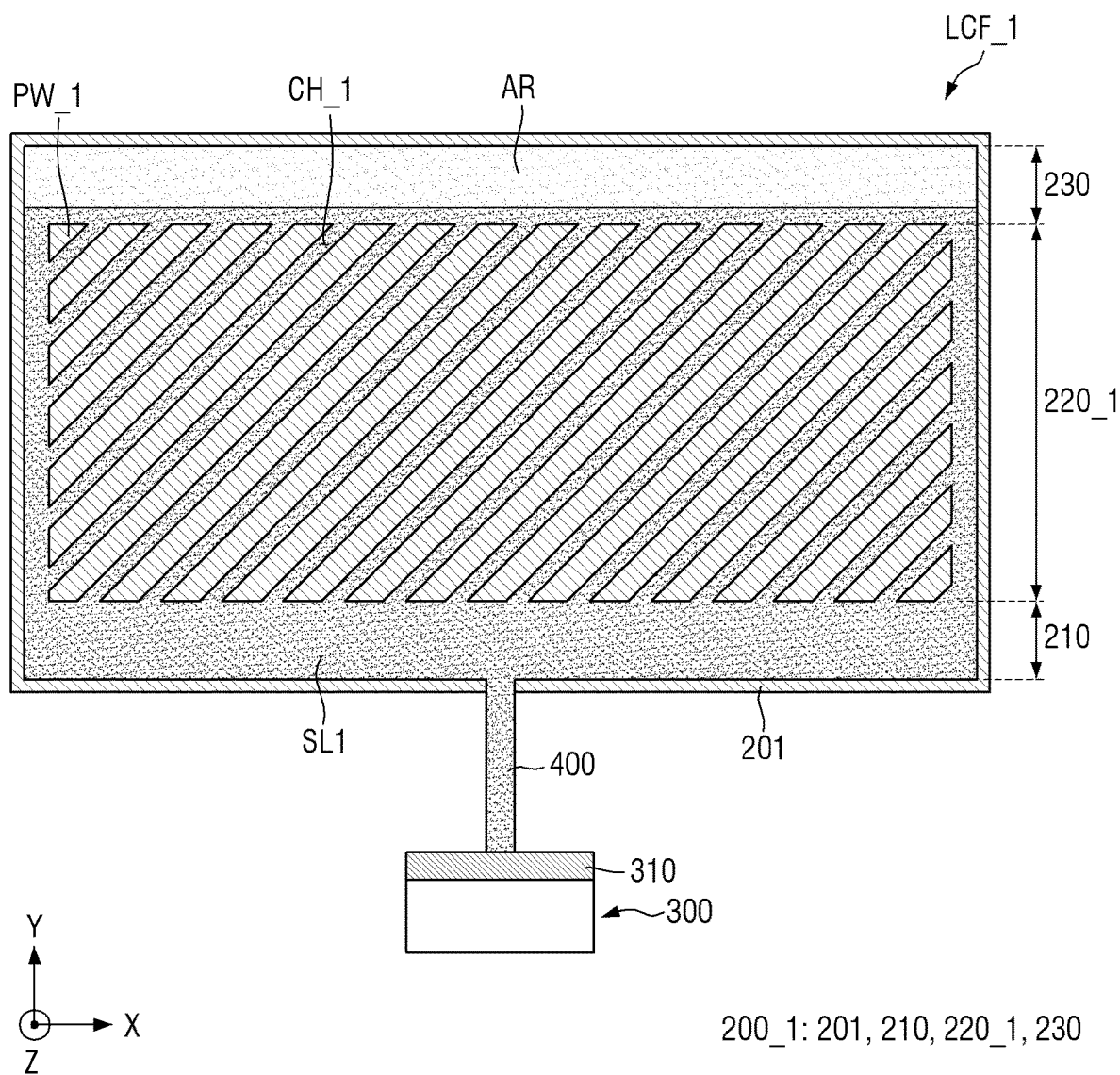
FIG. 15 is a schematic diagram illustrating a narrow view angle mode of the light path control member of FIG. 14.

FIG. 14 is a schematic diagram of a light path control member according to another embodiment. FIG. 15 is a schematic diagram illustrating a modified example of the light path control member according to the embodiment of FIG. 14. FIG. 14 is a diagram illustrating a light path control member in the wide viewing angle mode, and FIG. 15 is a diagram illustrating a light path control member in the narrow viewing angle mode.

Referring to FIGS. 1 and 2 in conjunction with FIGS. 14 and 15, a light path control member LCF_1 according to the embodiment is different from the light path control member LCF according to an embodiment in that it includes a housing 200_1 including a plurality of partition walls PW_1 extending in a direction between the first direction X and the second direction Y in a plan view. In an embodiment, the partition walls PW_1 and the channels CH_1 that are inclined may be disposed in a louver portion 220_1 of the housing 200_1.

In an embodiment, the plurality of partition walls PW_1 may be inclined to extend in a direction (e.g., a diagonal direction) between the first direction X and the second direction Y. For example, the extension direction of the partition walls PW_1 may extend in other directions that intersect the first direction X that is the extension direction of the first edge LS of the display panel 100 and that also cross the second direction Y that is the extension direction of the second edge SS. An angle in which the plurality of partition walls PW_1 are inclined with respect to the first direction X and the second direction Y may be about 45°, but embodiments are not limited thereto, and may be greater or less than about 45°. The plurality of partition walls PW_1 may extend in a direction substantially parallel to each other. Accordingly, the channels CH_1 defined between the partition walls PW_1 adjacent to each other among the plurality of partition walls PW_1 may also be inclined to extend in substantially the same direction as the partition walls PW_1.

When the light absorbing solution SL1 fills the channels CH_1 through the partition walls PW_1 and the channels CH_1 that are disposed at an inclined angle, the light path control member LCF_1 according to an embodiment may form the louver LV extending in substantially the same direction as the direction of the channels CH_1.

The lengths of the partition walls PW_1 may be different from each other according to the positions thereof in the housing 200_1. For example, the lengths of the partition walls PW_1 may gradually increase as moving toward the first direction X and then gradually decrease again. Correspondingly, the lengths of the channels CH_1 may also be different from each other according to the positions thereof, and the lengths of the channels CH_1 may gradually increase as moving toward the first direction X and then gradually decrease again.

In the narrow viewing angle mode, the fluid transfer portion 300 may introduce the light absorbing solution SL1 into the channels CH_1. In the narrow viewing angle mode, the light absorbing solution SL1 may fill the entirety of the channels CH_1 of the louver portion 220_1 and the first fluid accommodating portion 210, but the second fluid accommodating portion 230 may be partially filled.

The light path control member LCF_1 according to an embodiment may freely adjust or change the viewing angle according to the user's selection through a wide viewing angle mode because the light absorbing solution SL1 is disposed outside the channels CH_1 and a narrow viewing angle mode because the light absorbing solution SL1 is disposed inside the channels CH_1.

In addition, the light path control member LCF_1 may be driven through the fluid transfer portion 300 using a mechanical force, so that it is possible to easily implement the viewing angle adjustment.

Moreover, when the light absorbing solution SL1 fills the channels CH_1 through the partition walls PW_1 and the channels CH_1 that are disposed at an inclined angle, the light path control member LCF_1 according to an embodiment may form the louver LV extending in substantially the same direction as the direction of the channels CH_1. The louver LV extending in a direction between the first direction X and the second direction Y may partially limit the path of the light L emitted to one side and the other side of the first direction X and one side and the other side of the second direction Y. For example, the light path control member LCF_1 according to an embodiment may limit the path of the light L emitted from the display panel 100 in the narrow viewing angle mode in various directions.

Figure 16:
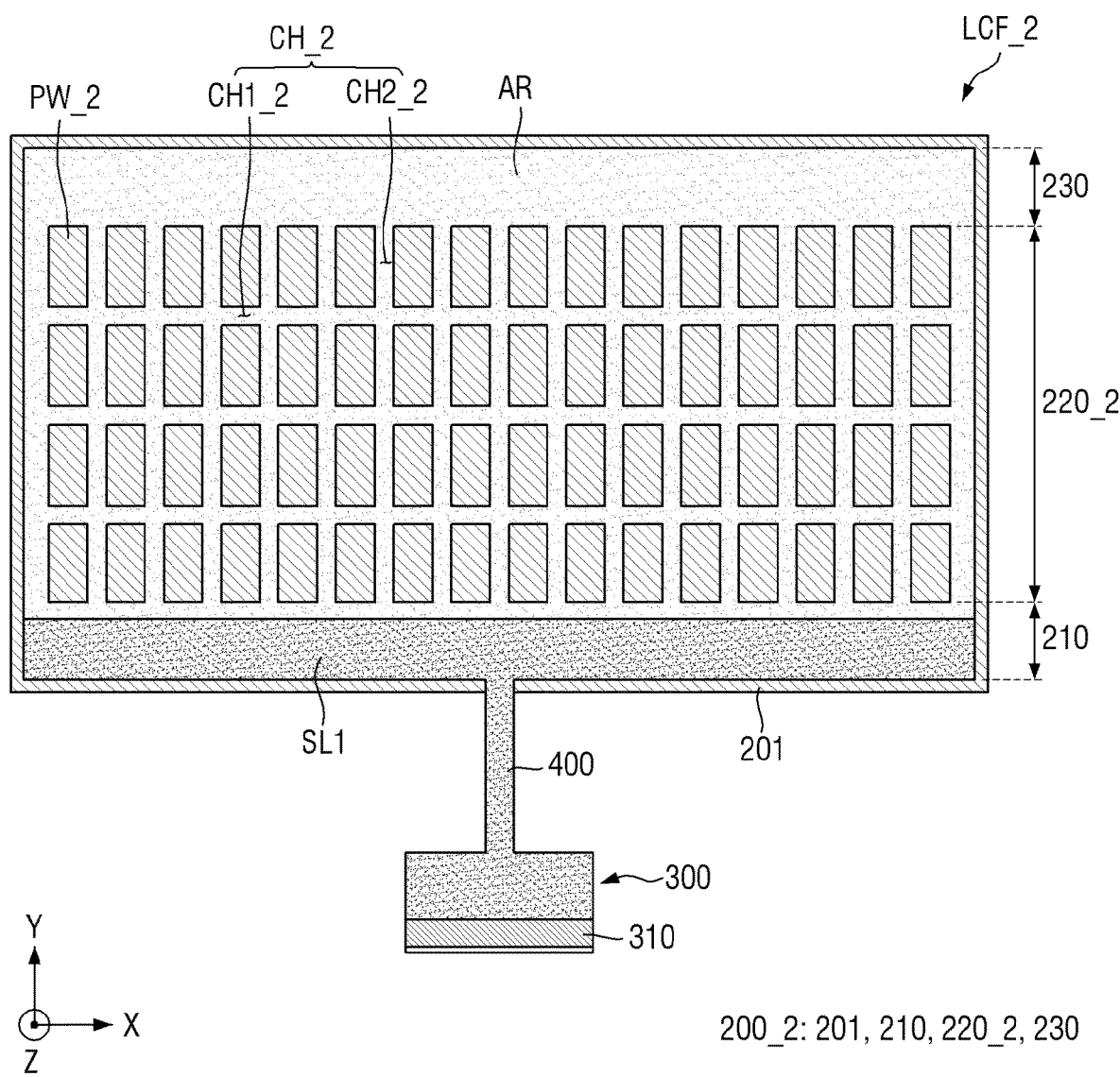
FIG. 16 is a schematic diagram of still another embodiment of the light path control member of the display device of FIG. 2 in a wide view angle mode.
Figure 17:
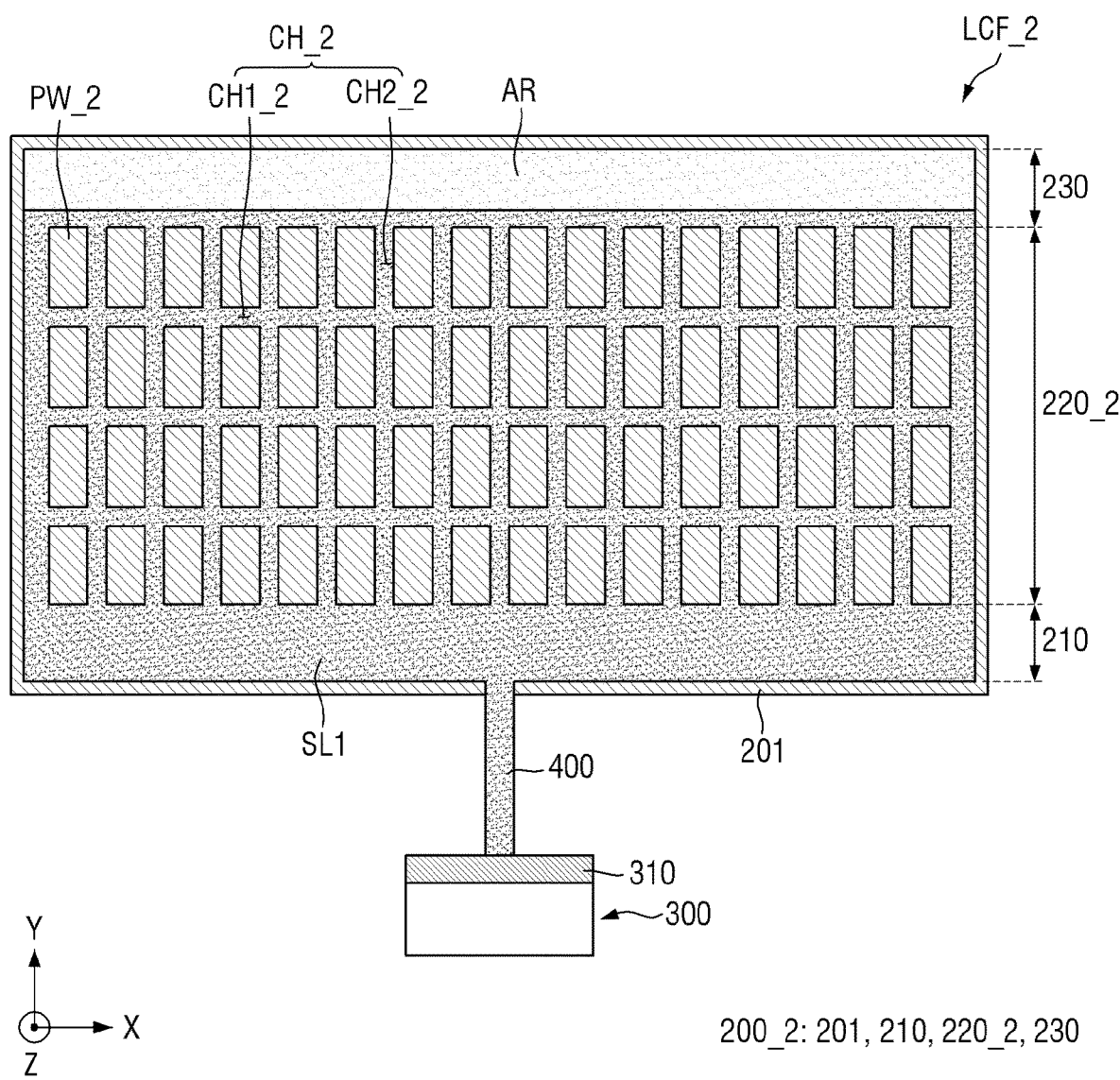
FIG. 17 is a schematic diagram illustrating a narrow view angle mode of the light path control member of FIG. 16.

FIG. 16 is a schematic diagram of a light path control member according to still another embodiment. FIG. 17 is a schematic diagram illustrating a modified example of the light path control member according to the embodiment of FIG. 16. FIG. 16 is a diagram illustrating a light path control member in the wide viewing angle mode, and FIG. 17 is a diagram illustrating a light path control member in the narrow viewing angle mode.

Referring to FIGS. 16 and 17, a light path control member LCF_2 according to an embodiment is different from the light path control member LCF according to an embodiment in that it includes a louver portion 220_2 including a plurality of partition walls PW_2 disposed in a lattice shape. In other words, the partition walls PW_2 included in the light path control member LCF_2 according to an embodiment may be a sub-partition wall that is formed as any one of the partition walls PW included in the light path control member LFC according to an embodiment is divided and disposed to be spaced apart in the second direction Y.

In an embodiment, the plurality of partition walls PW_2 disposed on the louver portion 220_2 may be arranged in a matrix shape in the first direction X and the second direction Y. The plurality of partition walls PW_2 may be arranged to be spaced apart from each other in the first direction X, and may be arranged to be spaced apart from each other in the second direction Y. The louver portion 220_2 may include a plurality of channels CH_2 disposed between the partition walls PW_2 adjacent to each other among the plurality of partition walls PW_2. The channels CH_2 may include a first channel CH1_2 extending in the first direction X and a second channel CH2_2 extending in the second direction Y. The first channel CH1_2 may be defined between the partition walls PW_2 adjacent in the second direction Y among the plurality of partition walls PW_2 arranged in a lattice shape, and the second channel CH2_2 may be defined between the partition walls PW_2 adjacent in the first direction X among the plurality of partition walls PW_2 arranged in a lattice shape.

In the narrow viewing angle mode, the fluid transfer portion 300 may introduce the light absorbing solution SL1 into the channels CH_2. In the narrow viewing angle mode, the light absorbing solution SL1 may fill the entirety of the channels CH_2 of the louver portion 220_1 and the first fluid accommodating portion 210, but the second fluid accommodating portion 230 may be partially filled. The light path control member LCF_2 according to the present embodiment may freely adjust or change the viewing angle according to the user's selection through a wide viewing angle mode because the light absorbing solution SL1 is disposed outside the channels CH_2 and a narrow viewing angle mode because the light absorbing solution SL1 is disposed inside the channels CH_2.

In addition, the light path control member LCF_2 may be driven through the fluid transfer portion 300 using a mechanical force, so that it is possible to easily implement the viewing angle adjustment.

Moreover, the light path control member LCF_2 according to an embodiment may partially limit the path of the light L spreading to one side and the other side of the first direction X and to one side and the other side of the second direction Y among the light L emitted to one side of the third direction Z, when the light absorbing solution SL1 fills the first channel CH1_2 and the second channel CH2_2 to form the louver LV through the plurality of partition walls PW_2 arranged in a lattice shape. For example, the light path control member LCF_2 according to an embodiment may limit the path of the light L emitted from the display panel 100 in the narrow viewing angle mode in various directions.

The planar shape of the partition walls PW_1 and PW_2 described above with reference to FIGS. 14 to 17 may be equally applied to light path control members LCF_3, LCF_4, LCF_5, LCF_6, and LCF_7 to be described later with reference to FIGS. 18 to 27.

Figure 18:
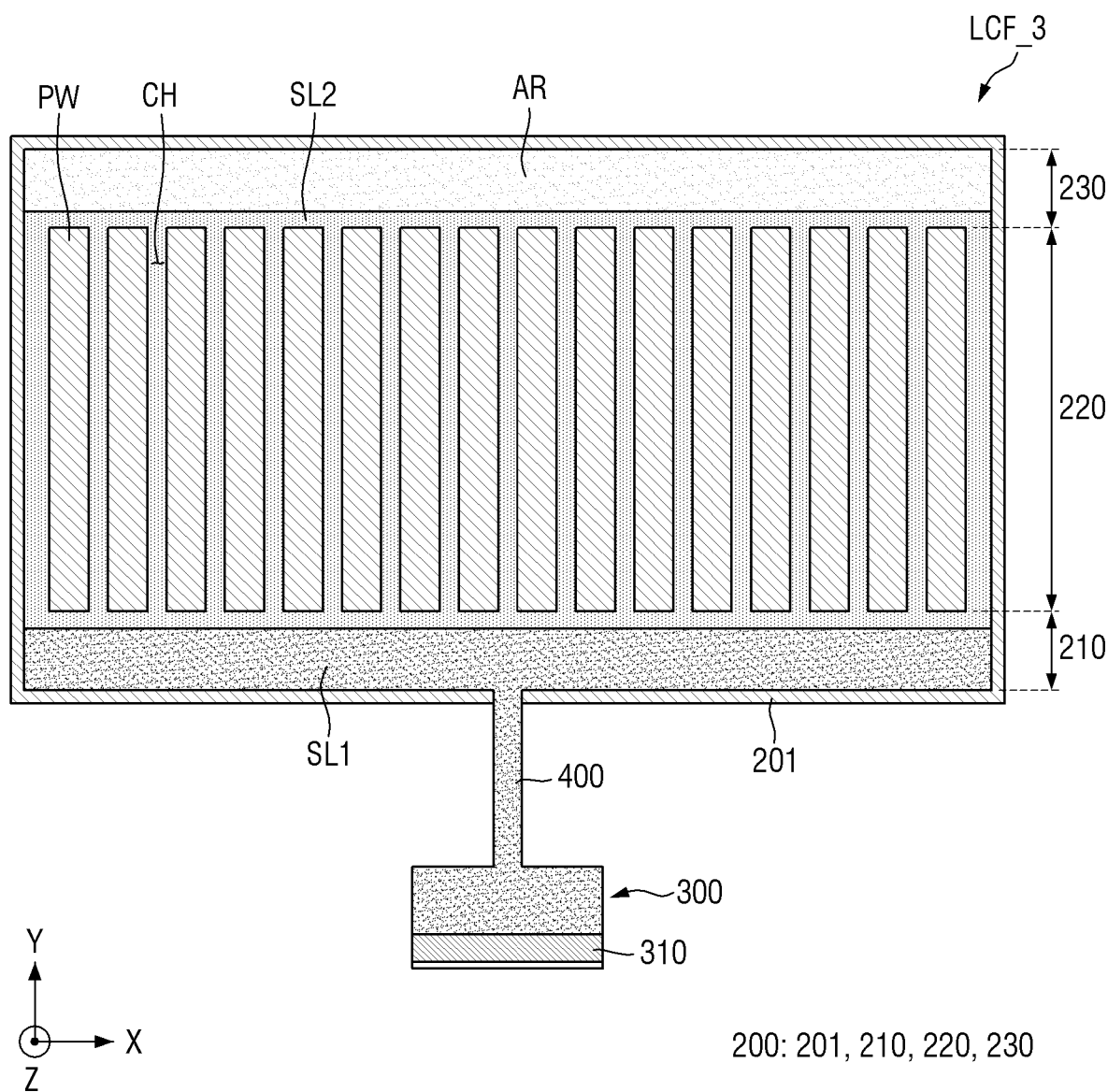
FIG. 18 is a schematic diagram of still another embodiment of the light path control member of the display device of FIG. 2 in a wide view angle mode.
Figure 19:
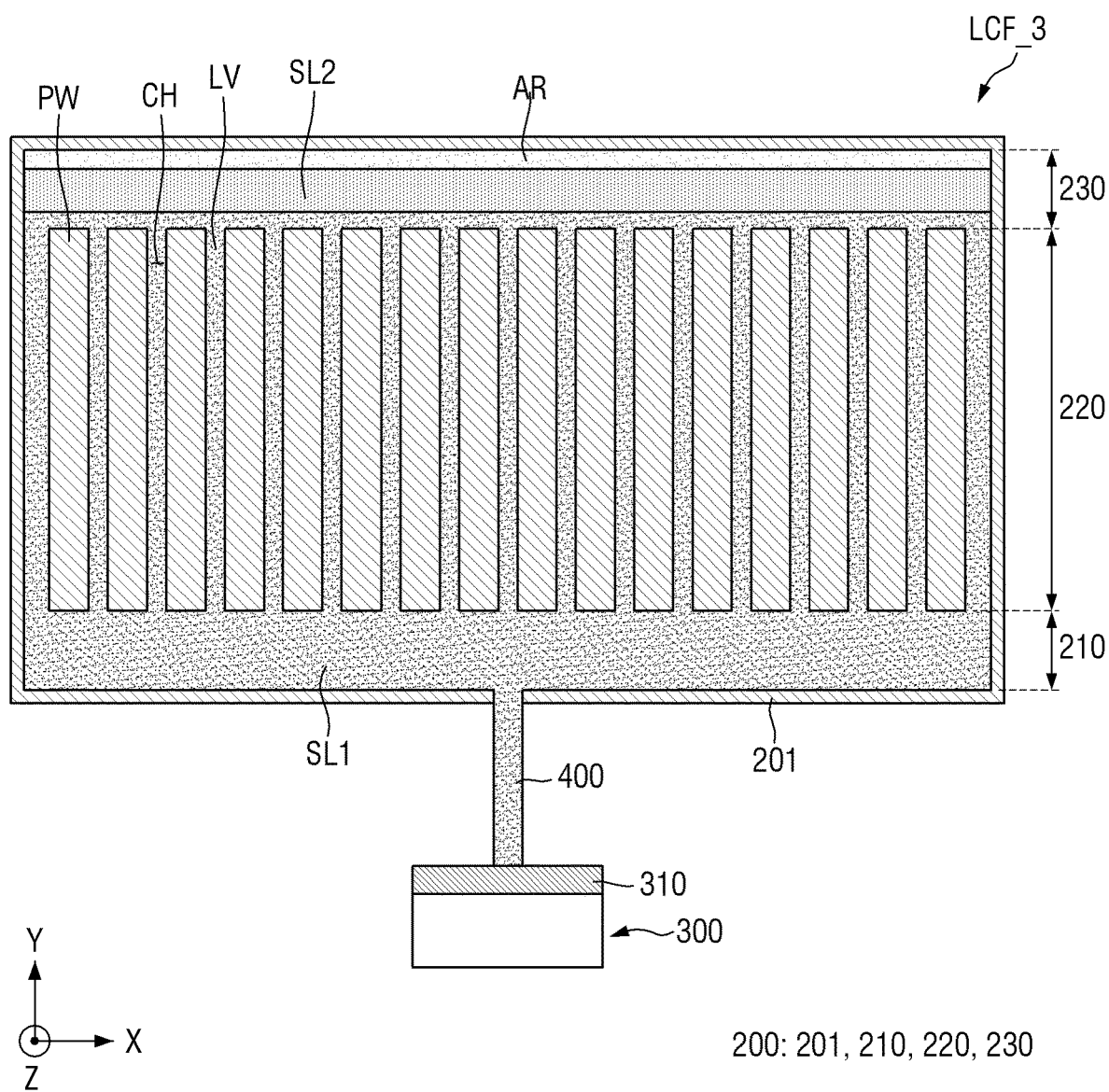
FIG. 19 is a schematic diagram illustrating a narrow view angle mode of the light path control member of FIG. 18.

FIG. 18 is a schematic diagram of a light path control member according to still another embodiment. FIG. 19 is a schematic diagram illustrating a modified example of the light path control member according to the embodiment of FIG. 18. FIG. 18 is a diagram illustrating a light path control member in the wide viewing angle mode, and FIG. 19 is a diagram illustrating a light path control member in the narrow viewing angle mode.

Referring to FIGS. 18 and 19, a light path control member LCF_3 according to an embodiment is different from the light path control member LFC according to an embodiment in that it further includes a light transmitting solution SL2.

In an embodiment, the light transmitting solution SL2 may fill the channels CH disposed in the louver portion 220 in the wide viewing angle mode. Moreover, the light transmitting solution SL2 may be partially disposed in the first fluid accommodating portion 210 and the second fluid accommodating portion 230.

FIG. 17 illustrates the first fluid accommodating portion 210 in which the light absorbing solution SL1 and the light transmitting solution SL2 are filled together, but embodiments are not limited thereto, and the first fluid accommodating portion 210 may be filled with only either the light absorbing solution SL1 or the light transmitting solution SL2. On the other hand, the second fluid accommodating portion 230 may be partially filled with the light transmitting solution SL2, and the rest thereof may be filled with the gas AR. The gas AR may include colorless air and an inert gas.

The light transmitting solution SL2 may not be immiscible with the light absorbing solution SL1. Here, the term "immiscible" may be referred to as that layer separation occurs without forming a homogeneous mixture with each other. For example, when the light absorbing solution SL1 is water-soluble, the light transmitting solution SL2 may be oil-soluble, and when the light absorbing solution SL1 is oil-soluble, the light transmitting solution SL2 may be water-soluble. In addition, when the light absorbing solution SL1 is a polar solution, the light transmitting solution SL2 may be a non-polar solution, and when the light absorbing solution SL1 is a non-polar solution, the light transmitting solution SL2 may be a polar solution.

In addition, the light transmitting solution SL2 may have a smaller density than the light absorbing solution SL1. Accordingly, the light transmitting solution SL2 may be positioned above the light absorbing solution SL1, and layers may be separated from each other.

The light transmitting solution SL2 may have a refractive index similar to that of the partition wall PW. Specifically, the light transmitting solution SL2 may have a refractive index difference of about 0.5 or less, about 0.3 or less, or about 0.1 or less from the partition wall PW. When the refractive index difference between the transmitting solution SL2 and the partition wall PW is about 0.5 or less, the path of the light L emitted from the display panel 100 in the wide viewing angle mode in which the transmitting solution SL2 fills the channels CH may not be significantly changed at the interface between the light transmitting solution SL2 and the partition wall PW, so that a natural image (e.g., an original image) may be displayed.

In addition, the light transmitting solution SL2 may include a light transmitting material that transmits light L. The light transmitting solution SL2 may include at least one of water, acetone, alcohol, and other transparent organic solvents, but embodiments are not limited thereto.

In the narrow viewing angle mode, the fluid transfer portion 300 may introduce the light absorbing solution SL1 into the channels CH_2. Accordingly, the light transmitting solution SL2 may move to the second fluid accommodating portion 230. In the narrow viewing angle mode, the light absorbing solution SL1 may fill the entirety of the channels CH_2 of the louver portion 220_1 and the first fluid accommodating portion 210, but the second fluid accommodating portion 230 may be partially filled. In addition, the light transmitting solution SL2 and the gas AR may be accommodated in the second fluid accommodating portion 230. As the volume of the gas AR decreases, the internal pressure may increase.

The light path control member LCF_3 according to an embodiment may freely adjust or change the viewing angle according to the user's selection through a wide viewing angle mode because the light absorbing solution SL1 is disposed outside the channels CH and a narrow viewing angle mode because the light absorbing solution SL1 is disposed inside the channels CH.

In addition, the light path control member LCF_3 may be driven through the fluid transfer portion 300 using a mechanical force, so that it is possible to easily implement the viewing angle adjustment.

Moreover, the light path control member LCF_3 according to an embodiment fills the channels CH at a wide viewing angle, and a natural image may be displayed because the path of the light L emitted from the display panel 100 is not significantly changed at the interface between the light transmitting solution SL2 and the partition walls PW through the light transmitting solution SL2 having a refractive index difference of about 0.5 or less from the partition walls PW.

Figure 20:
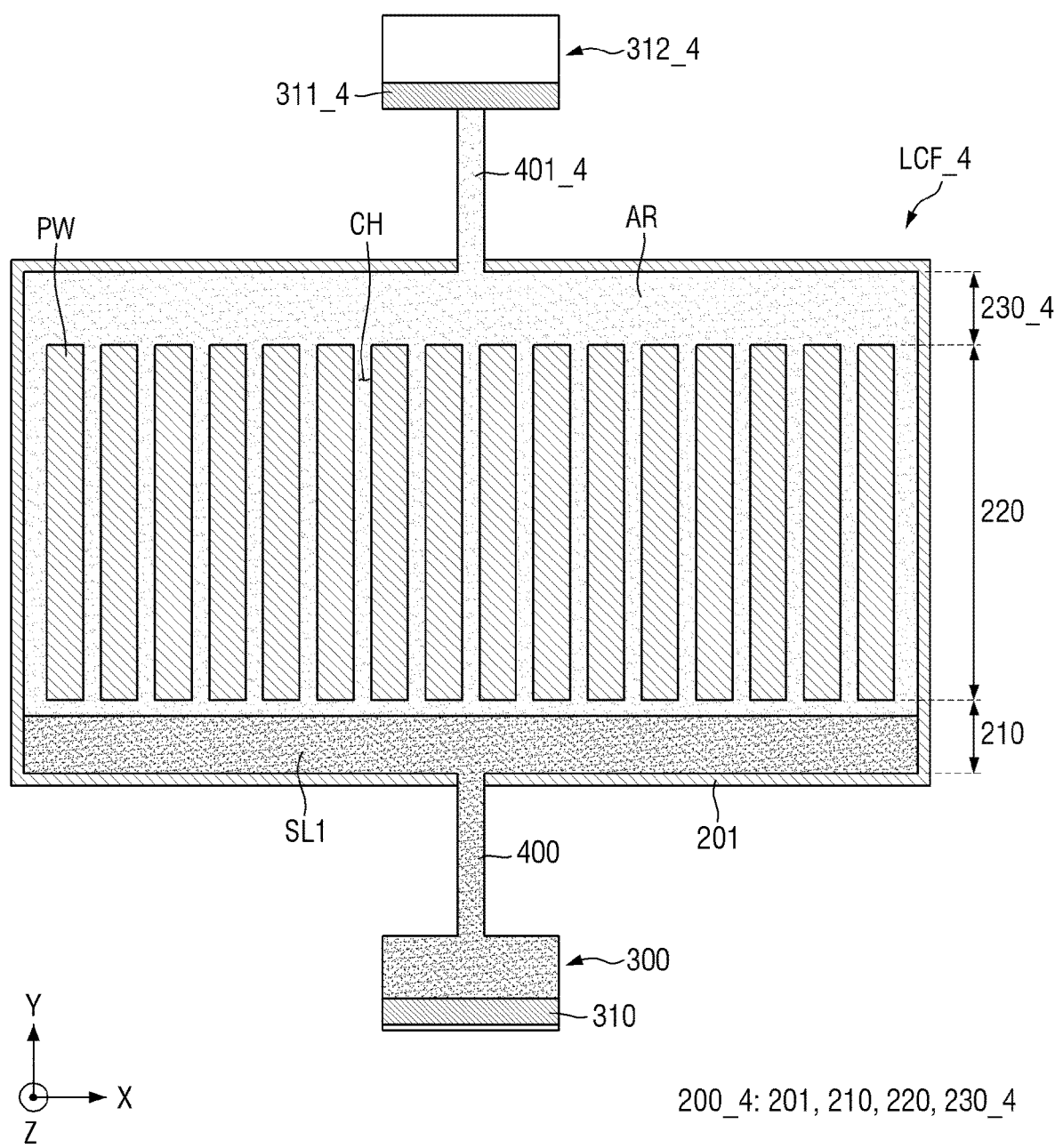
FIG. 20 is a schematic diagram of still another embodiment of the light path control member of the display device of FIG. 2 in a wide view angle mode.
Figure 21:
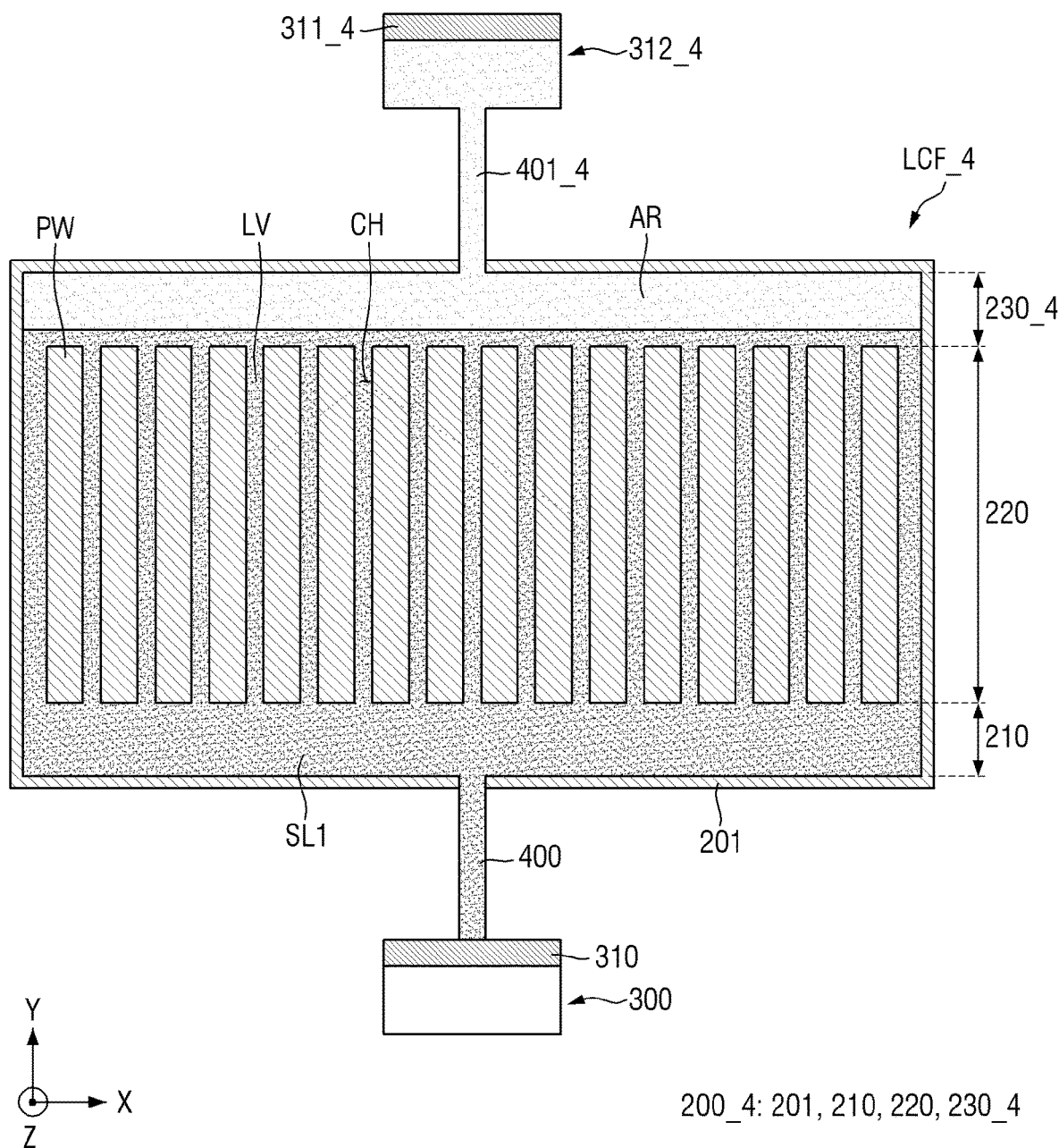
FIG. 21 is a schematic diagram illustrating a narrow view angle mode of the light path control member of FIG. 20.

FIG. 20 is a schematic diagram of a light path control member according to still another embodiment. FIG. 21 is a schematic diagram illustrating a modified example of the light path control member according to the embodiment of FIG. 20. FIG. 20 is a diagram illustrating a light path control member in the wide viewing angle mode, and FIG. 21 is a diagram illustrating a light path control member in the narrow viewing angle mode.

Referring to FIGS. 20 and 21, a light path control member LCF_4 according to an embodiment is different from the light path control member LCF according to an embodiment in that it further includes an auxiliary fluid transfer portion 312_4 that provides a negative pressure and a positive pressure to a second fluid accommodating portion 230_4 to control the movement of the gas AR, and an auxiliary connection portion 401_4 that spatially connects the auxiliary fluid transfer portion 312_4 to the second fluid accommodating portion 230_4. For example, the auxiliary connection portion 401_4 may be used for a fluid connection between the auxiliary fluid transfer portion 312_4 and the second fluid accommodating portion 230_4. In addition, in an embodiment, the second fluid accommodating portion 230_4 is different from the light path control member LCF according to an embodiment in that it is opened on one side of the second direction Y and is spatially connected to the auxiliary connection portion 401_4. For example, a material positioned in the second fluid accommodating portion 230_4 and a material positioned in the channels CH may move or interchange therebetween. In an embodiment, the auxiliary fluid transfer portion 312_4 may provide a negative pressure to the second fluid accommodating portion 230_4 when switching from the wide viewing angle mode, which is the first mode of the fluid transfer portion 300, to the narrow viewing angle mode, thereby removing the gas AR of the second fluid accommodating portion 230_4, and thus may assist in the process in which the light absorbing solution SL1 fills the channels CH. For example, the light absorbing solution SL1 may quickly fill the channels CH through the negative pressure provided by the auxiliary fluid transfer portion 312_4.

In addition, the auxiliary fluid transfer portion 312_4 may provide a positive pressure to the second fluid accommodating portion 230_4 when switching from the narrow viewing angle mode, which is the second mode of the fluid transfer portion 300, to the wide viewing angle mode, thereby providing the gas AR to the second fluid accommodating portion 230_4 and the louver portion 220, and thus may assist in a process in which the light absorbing solution SL1 is discharged from the channels CH. For example, the light absorbing solution SL1 may be rapidly discharged from the channels CH through the positive pressure provided by the auxiliary fluid transfer portion 312_4.

The auxiliary fluid transfer portion 312_4 and the auxiliary connection portion 401_4 may have substantially the same configuration as the fluid transfer portion 300 and the connection portion 400, respectively, but embodiments are not limited thereto.

The light path control member LCF_4 according to an embodiment may freely adjust or change the viewing angle according to the user's selection through a wide viewing angle mode because the light absorbing solution SL1 is disposed outside the channels CH and a narrow viewing angle mode because the light absorbing solution SL1 is disposed inside the channels CH.

In addition, the light path control member LCF_4 may be driven through the fluid transfer portion 300 using a mechanical force, so that it is possible to easily implement the viewing angle adjustment.

Moreover, the light path control member LCF_4 according to an embodiment may assist so that the process in which the light absorbing solution SL1 fills the channels CH through the auxiliary fluid transfer portion 312_4 and the auxiliary connection portion 401_4, is made more quickly.

Figure 22:
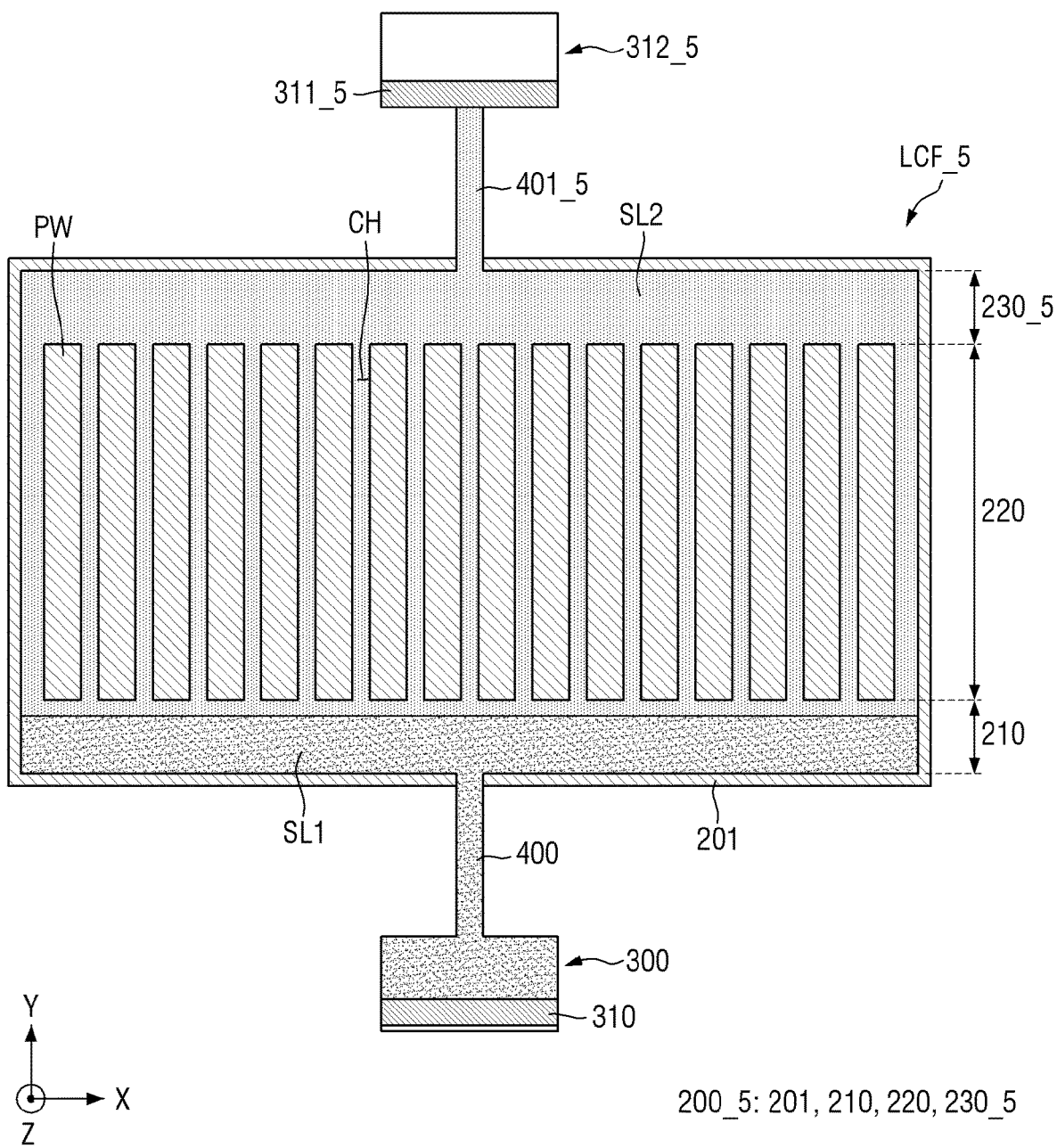
FIG. 22 is a schematic diagram of still another embodiment of the light path control member of the display device of FIG. 2 in a wide view angle mode.
Figure 23:
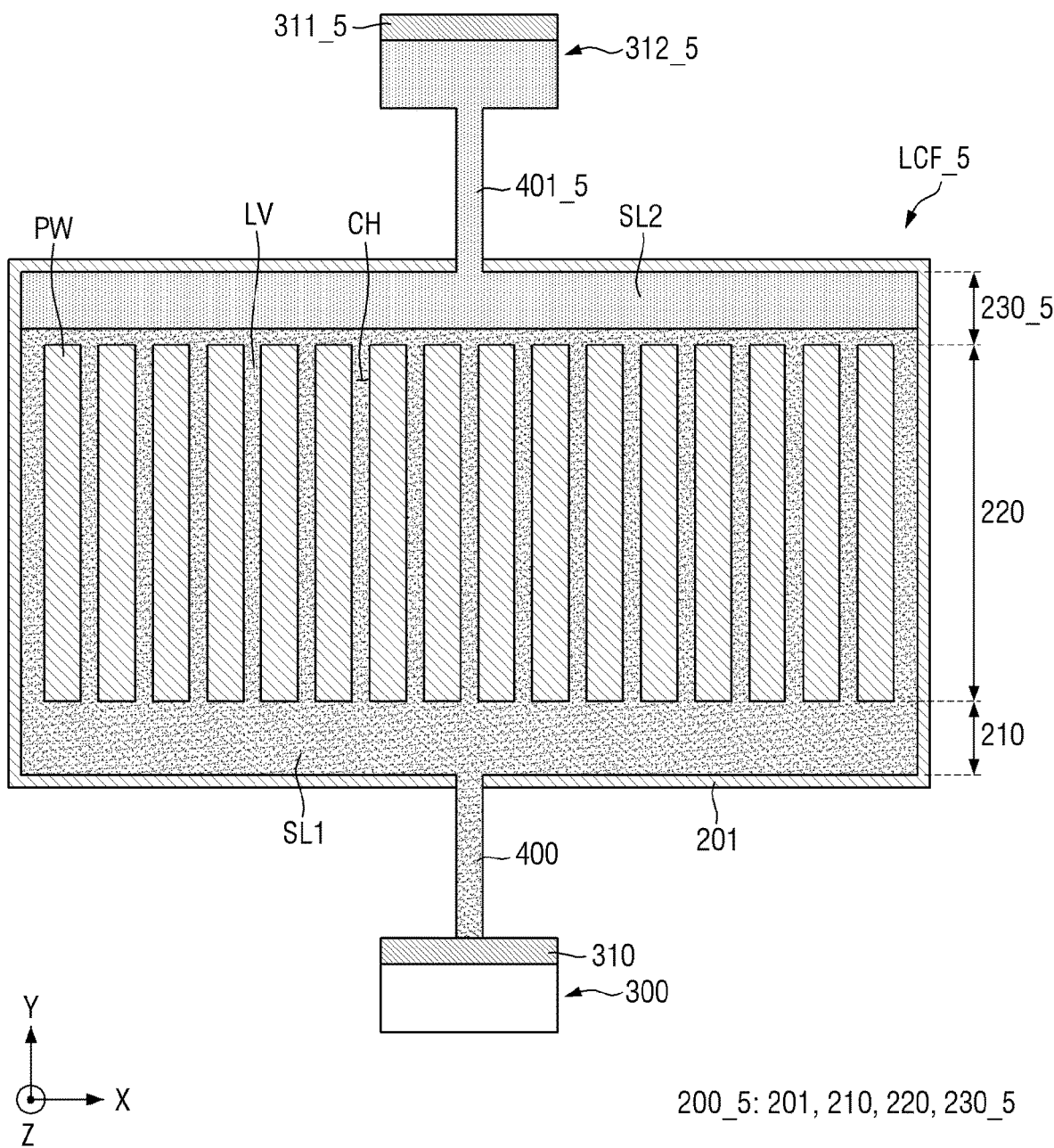
FIG. 23 is a schematic diagram illustrating a narrow view angle mode of the light path control member of FIG. 22.

FIG. 22 is a schematic diagram of a light path control member according to still another embodiment. FIG. 23 is a schematic diagram illustrating a modified example of the light path control member according to the embodiment of FIG. 22. FIG. 22 is a diagram illustrating a light path control member in the wide viewing angle mode, and FIG. 23 is a diagram illustrating a light path control member in the narrow viewing angle mode.

Referring to FIGS. 22 and 23, a light path control member LCF_5 according to an embodiment is different from the light path control member LCF_3 according to the embodiment described above with reference to FIGS. 18 and 19 in that it completely fills a second fluid accommodating portion 230_5 with the light transmitting solution SL2, and further includes an auxiliary fluid transfer portion 312_5 providing a negative pressure and a positive pressure to the second fluid accommodating portion 230_5, and an auxiliary connection portion 401_5 spatially connecting the auxiliary fluid transfer portion 312_5 to the second fluid accommodating portion 230_5. For example, the auxiliary connection portion 401_5 may be used for a fluid connection between the auxiliary fluid transfer portion 312_5 and the second fluid accommodating portion 230_5. In addition, in an embodiment, the second fluid accommodating portion 230_5 is different from the light path control member LCF according to an embodiment in that the second fluid accommodating portion 230_5 has an opening on one side of the second direction Y and is spatially connected to the auxiliary connection portion 401_5. For example, the material positioned in the auxiliary fluid transfer portion 312_5 and the material positioned in the second fluid accommodating portion 230_5 may move or interchange therebetween by the auxiliary connection portion 401_5.

In addition, the light path control member LCF_5 according to an embodiment is different from the light path control member LCF_4 according to the embodiment described above with reference to FIGS. 20 and 21 in that the light transmitting solution SL2 is disposed instead of the gas AR.

In the light path control member LCF_5 according to an embodiment, the light transmitting solution SL2 may be filled in the channels CH of the louver portion 220 in the wide viewing angle mode, and the light absorbing solution SL1 may be filled therein in the narrow viewing angle mode.

In an embodiment, the auxiliary fluid transfer portion 312_5 may assist the movement to smoothly fill and discharge the light transmitting solution SL2 and the light absorbing solution SL1 when switching from the wide viewing angle mode, which is the first mode of the fluid transfer portion 300, to the narrow viewing angle mode, and when switching from the narrow viewing angle mode, which is the second mode of the fluid transfer portion 300, to the wide viewing angle mode.

Specifically, when switching from the wide viewing angle mode, which is the first mode of the fluid transfer portion 300, to the narrow viewing angle mode, the light transmitting solution SL2 filling the channels CH is discharged to the outside of the channels CH and the light absorbing solution SL1 fills the channel CH, and at this time, the auxiliary fluid transfer portion 312_5 may provide a negative pressure to suck the light transmitting solution SL2. Through this, it may assist that the light transmitting solution SL2 is discharged to the outside of the channels CH, and the light absorbing solution SL1 fills the channels CH.

In addition, when switching from the narrow viewing angle mode, which is the second mode of the fluid transfer portion 300, to the wide viewing angle mode, the light absorbing solution SL1 filling the channels CH is discharged to the outside of the channels CH and the light transmitting solution SL2 fills the channels CH, and at this time, the auxiliary fluid transfer portion 312_5 may provide a positive pressure to push the light transmitting solution SL2 toward the channels CH. Through this, it may assist that the light absorbing solution SL1 is discharged to the outside of the channels CH, and the light transmitting solution SL2 fills the channels CH.

The light path control member LCF_5 according to an embodiment may freely adjust or change the viewing angle according to the user's selection through a wide viewing angle mode because the light absorbing solution SL1 is disposed outside the channels CH and a narrow viewing angle mode because the light absorbing solution SL1 is disposed inside the channels CH.

In addition, the light path control member LCF_5 may be driven through the fluid transfer portion 300 using a mechanical force, so that it is possible to easily implement the viewing angle adjustment.

Moreover, the light path control member LCF_5 according to an embodiment may assist so that the process in which the light absorbing solution SL1 and the light transmitting solution SL2 fill the channels CH and are discharged from the channels CH through the auxiliary fluid transfer portion 312_5 and the auxiliary connection portion 401_5, is made more quickly.

Figure 24:
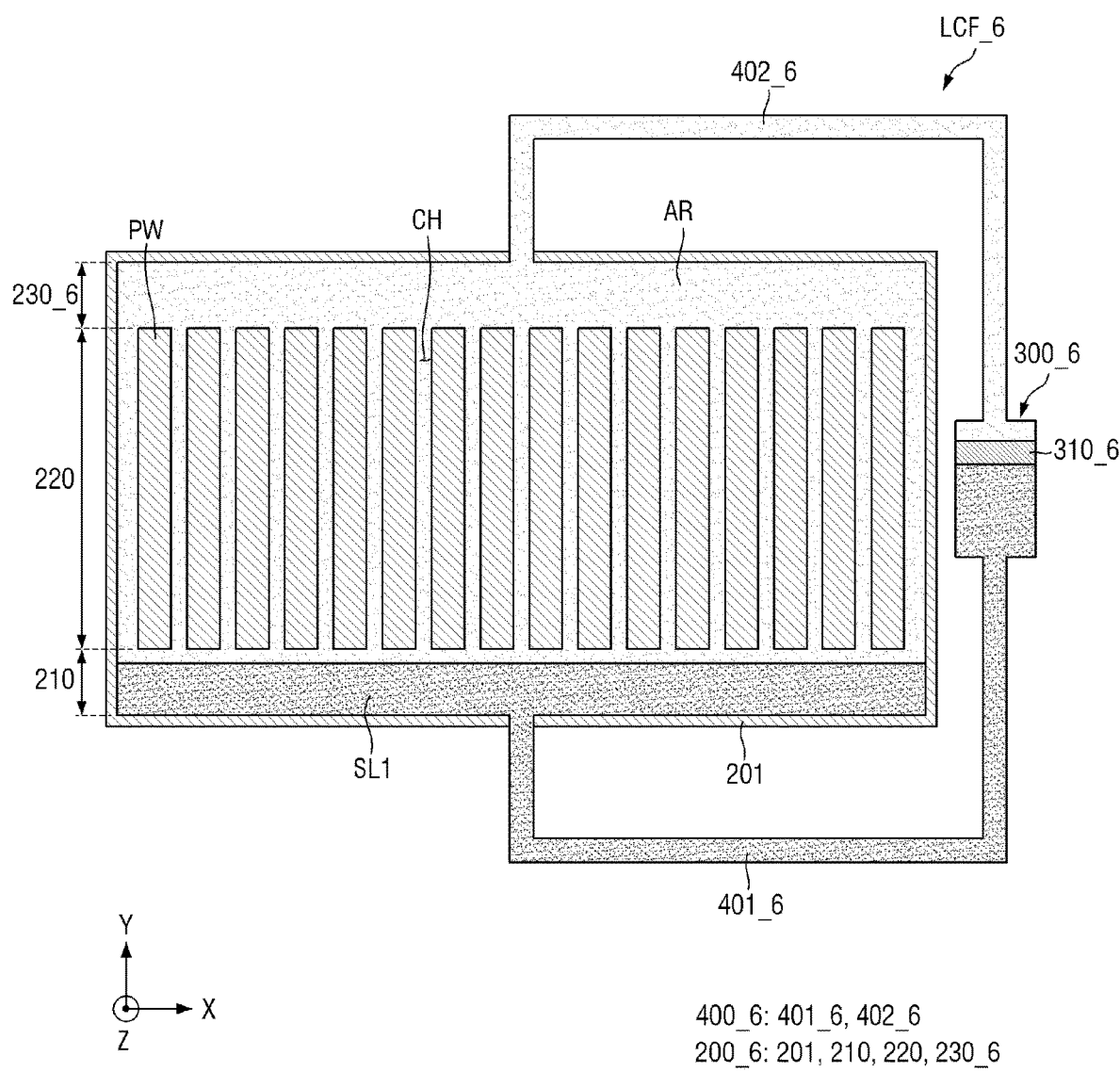
FIG. 24 is a schematic diagram of still another embodiment of the light path control member of the display device of FIG. 2 in a wide view angle mode.
Figure 25:
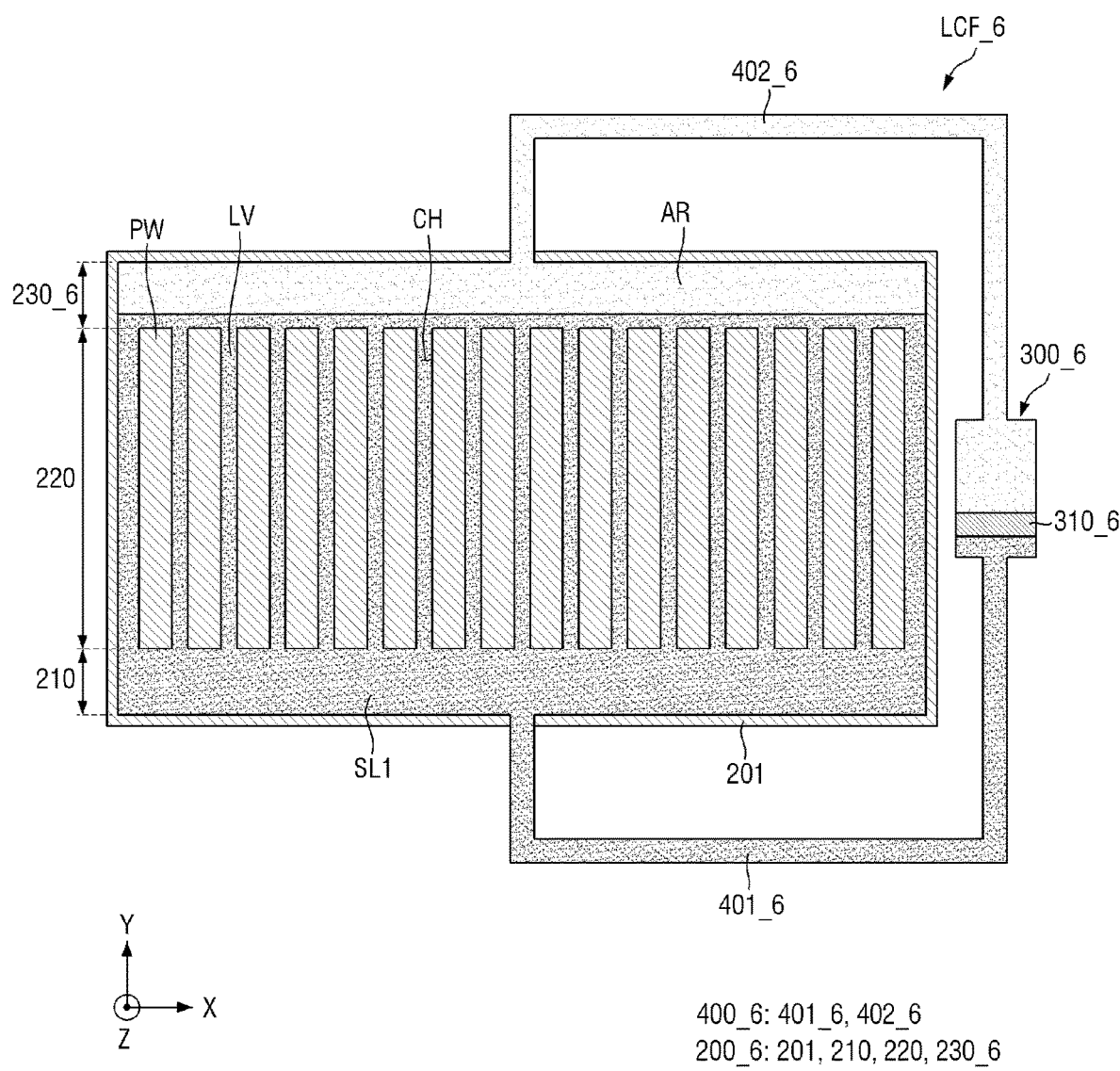
FIG. 25 is a schematic diagram illustrating a narrow view angle mode of the light path control member of FIG. 24.

FIG. 24 is a schematic diagram of a light path control member according to still another embodiment. FIG. 25 is a schematic diagram illustrating a modified example of the light path control member according to the embodiment of FIG. 24. FIG. 24 is a diagram illustrating a light path control member in the wide viewing angle mode, and FIG. 25 is a diagram illustrating a light path control member in the narrow viewing angle mode.

Referring to FIGS. 24 and 25, a fluid transfer portion 300_6 according to an embodiment is different from the light path control member LCF according to an embodiment in that it simultaneously controls not only flowing (e.g., entry and exit) of the light absorbing solution SL1 into and out of the channels CH, but also flowing (e.g., entry and exit) of the gas AR into and out of the channels CH.

In an embodiment, a connection portion 400_6 spatially connecting a housing 200_6 to the fluid transfer portion 300_6 may include a first connection portion 401_6 connecting the first fluid accommodating portion 210 to the fluid transfer portion 300_6, and a second connection portion 402_6 connecting a second fluid accommodating portion 230_6 to the fluid transfer portion 300_6. In addition, in an embodiment, the second fluid accommodating portion 230_6 is different from the light path control member LCF according to an embodiment in that the second fluid accommodating portion 230_6 has an opening on one side of the second direction Y and is spatially connected to the second connection portion 402_6.

In the wide viewing angle mode, the first fluid accommodating portion 210 may accommodate at least a part of the light absorbing solution SL1, and the channels CH of the louver portion 220 and the second fluid accommodating portion 230_6 may accommodate the gas AR. When a piston 310_6 of the fluid transfer portion 300_6 moves to the other side of the second direction Y, the light absorbing solution SL1 may fill the inside of the channels CH and the gas AR may be discharged to the outside of the channels CH. Through this, it is possible to switch from the wide viewing angle mode to the narrow viewing angle mode.

In the narrow viewing angle mode, the first fluid accommodating portion 210 and the channels CH of the louver portion 220 may be filled with the light absorbing solution SL1. The second fluid accommodating portion 230_6 may accommodate a part of the light absorbing solution SL1 and the gas AR, but embodiments are not limited thereto, and may be filled with the light absorbing solution SL1. When the piston 310_6 of the fluid transfer portion 300_6 moves to the one side of the second direction Y, the light absorbing solution SL1 may be discharged to the outside of the channels CH and the gas AR may fill the inside of the channels CH. Through this, it is possible to switch from the narrow viewing angle mode to the wide viewing angle mode.

The light path control member LCF_6 according to an embodiment may freely adjust or change the viewing angle according to the user's selection through a wide viewing angle mode because the light absorbing solution SL1 is disposed outside the channels CH and a narrow viewing angle mode because the light absorbing solution SL1 is disposed inside the channels CH.

In addition, the light path control member LCF_6 may be driven through the fluid transfer portion 300 using a mechanical force, so that it is possible to easily implement the viewing angle adjustment.

Moreover, the light path control member LCF_6 according to an embodiment may simultaneously control flowing (e.g., entry and exit) of the light absorbing solution SL1 and the gas AR into and out of the channels CH through one fluid transfer portion 300_6.

Figure 26:
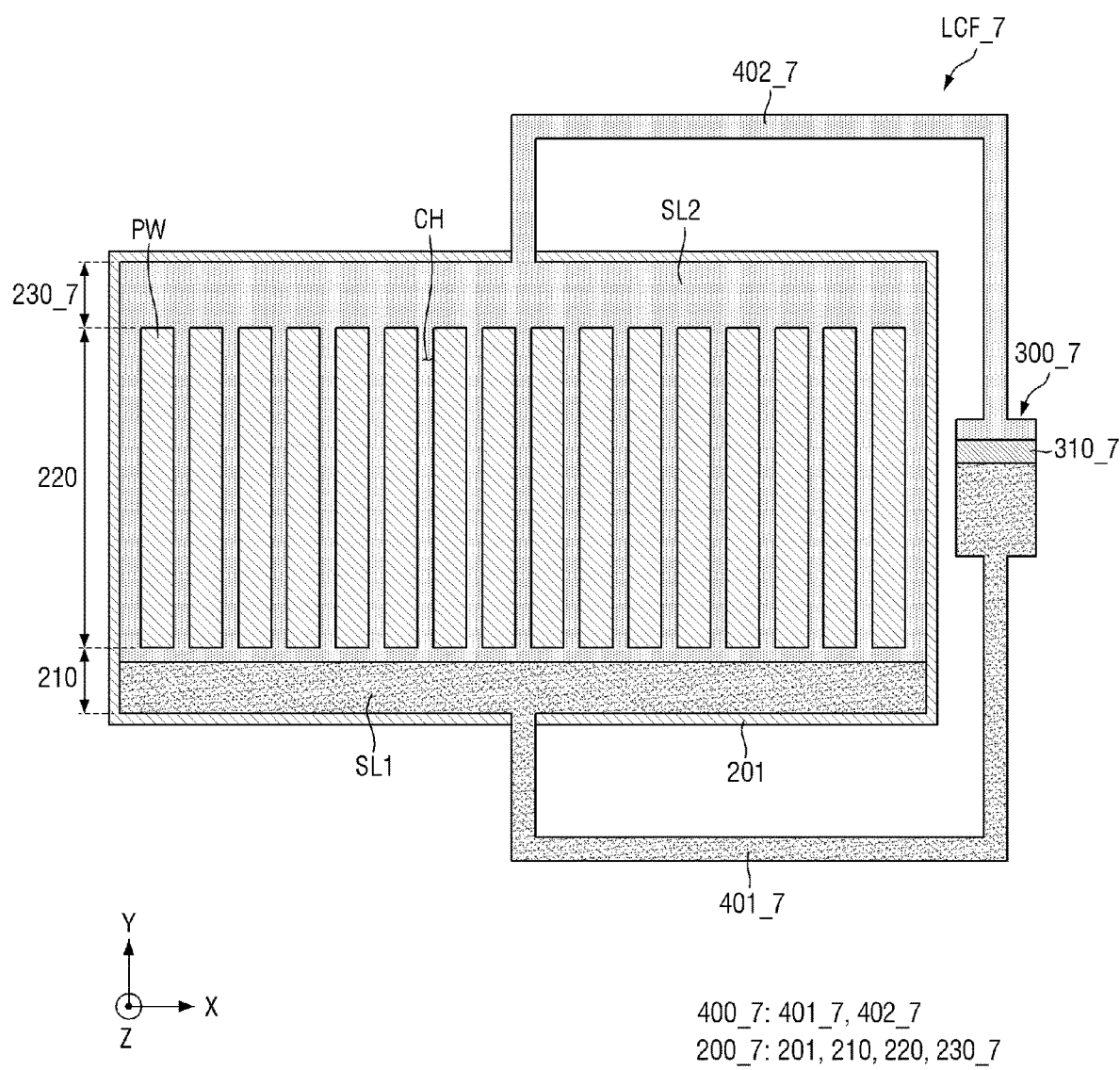
FIG. 26 is a schematic diagram of still another embodiment of the light path control member of the display device of FIG. 2 in a wide view angle mode.
Figure 27:
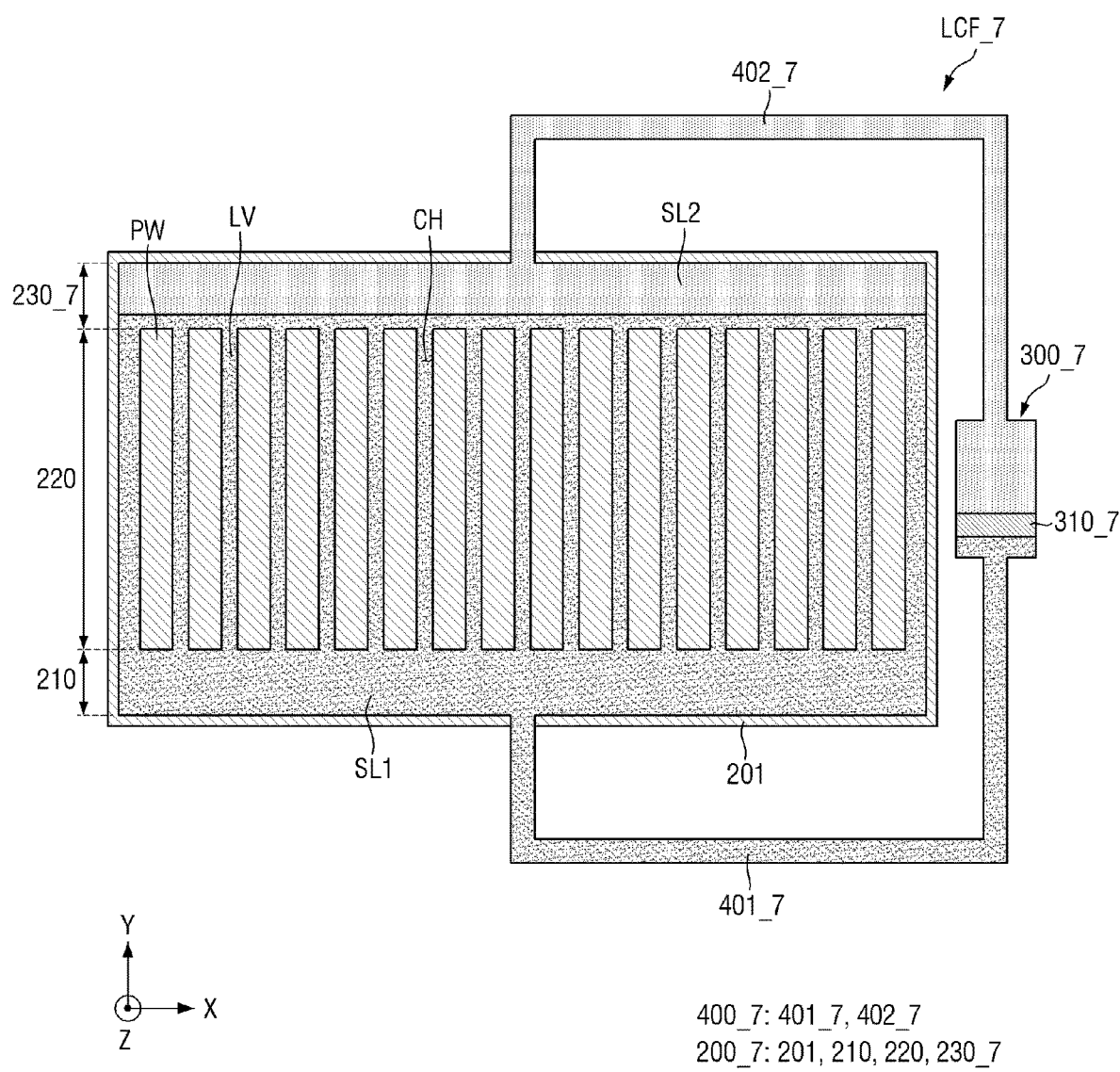
FIG. 27 is a schematic diagram illustrating a narrow view angle mode of the light path control member of FIG. 26.

FIG. 26 is a schematic diagram of a light path control member according to still another embodiment. FIG. 27 is a schematic diagram illustrating a modified example of the light path control member according to the embodiment of FIG. 26. FIG. 26 is a diagram illustrating a light path control member in the wide viewing angle mode, and FIG. 27 is a diagram illustrating a light path control member in the narrow viewing angle mode.

Referring to FIGS. 26 and 27, a fluid transfer portion 300_7 according to an embodiment different from the light path control member LCF according to an embodiment in that it simultaneously controls not only flowing (e.g., entry and exit) of the light absorbing solution SL1 into and out of the channels CH, but also flowing (e.g., entry and exit) of the light transmitting solution SL2 into and out of the channels CH.

In an embodiment, a connection portion 400_7 spatially connecting a housing 200_7 to the fluid transfer portion 300_7 may include a first connection portion 401_7 connecting the first fluid accommodating portion 210 to the fluid transfer portion 300_7, and a second connection portion 402_7 connecting a second fluid accommodating portion 230_7 to the fluid transfer portion 300_7. In addition, in an embodiment, the second fluid accommodating portion 230_7 is different from the light path control member LCF according to an embodiment in that the second fluid accommodating portion 230_7 has an opening on one side of the second direction Y and is spatially connected to the second connection portion 402_7.

In the wide viewing angle mode, the first fluid accommodating portion 210 may accommodate at least a part of the light absorbing solution SL1, and the channels CH of the louver portion 220 and the second fluid accommodating portion 230_7 may accommodate the light transmitting solution SL2. When a piston 310_7 of the fluid transfer portion 300_7 moves to the other side of the second direction Y, the light absorbing solution SL1 may fill the inside of the channels CH and the light transmitting solution SL2 may be discharged to the outside of the channels CH. Through this, it is possible to switch from the wide viewing angle mode to the narrow viewing angle mode.

In the narrow viewing angle mode, the first fluid accommodating portion 210 and the channels CH of the louver portion 220 may be filled with the light absorbing solution SL1. The second fluid accommodating portion 230_7 may accommodate a part of the light absorbing solution SL1 and the light transmitting solution SL2, but embodiments are not limited thereto, and may be filled with the light absorbing solution SL1. When the piston 310_7 of the fluid transfer portion 300_7 moves to the one side of the second direction Y, the light absorbing solution SL1 may be discharged to the outside of the channels CH and the light transmitting solution SL2 may fill the inside of the channels CH. Through this, it is possible to switch from the narrow viewing angle mode to the wide viewing angle mode.

The light path control member LCF_7 according to an embodiment may freely adjust or change the viewing angle according to the user's selection through a wide viewing angle mode because the light absorbing solution SL1 is disposed outside the channels CH and a narrow viewing angle mode because the light absorbing solution SL1 is disposed inside the channels CH.

In addition, the light path control member LCF_7 may be driven through the fluid transfer portion 300 using a mechanical force, so that it is possible to easily implement the viewing angle adjustment.

Moreover, the light path control member LCF_7 according to an embodiment may simultaneously control flowing (e.g., entry and exit) of the light absorbing solution SL1 and the light transmitting solution SL2 into and out of the channels CH through one fluid transfer portion 300_7.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel; and
    a light path control member disposed on the display panel, wherein the light path control member comprises:
        a housing comprising a plurality of partition walls and a channel defined between two adjacent partition walls among the plurality of partition walls;
        a light absorbing solution configured to block transmission of light; and a first fluid transfer portion configured to control flowing of the light absorbing solution into and out of the channel.

2. The display device of claim 1, wherein the light path control member further comprising a connection portion for providing a fluid connection between the housing and the first fluid transfer portion.

3. The display device of claim 2, wherein the housing further comprises a first accommodating portion disposed between the channel and the connection portion and configured to accommodate at least a part of the light absorbing solution, the first accommodating portion having a fluid connection with the connection portion and the channel.

4. The display device of claim 1, wherein the display panel comprises a display area and a non-display area disposed around the display area, and Wherein the display area overlaps the channel.

5. The display device of claim 4, wherein:
the housing further comprises a first accommodating portion having a fluid connection with the channel and configured to accommodate at least a part of the light absorbing solution, and
the non-display area overlaps the first accommodating portion.

6. The display device of claim 1, wherein a width of each of the plurality of partition walls is greater than a width of the channel.

7. The display device of claim 1, wherein the plurality of partition walls extend in substantially parallel with each other.

8. The display device of claim 7, wherein the display panel comprises a first edge extending in a first direction and a second edge extending in a second direction intersecting the first direction, and
the plurality of partition walls extend in any one of the first direction and the second direction.

9. The display device of claim 7, wherein the display panel comprises a first edge extending in a first direction and a second edge extending in a second direction intersecting the first direction, and
the plurality of partition walls extend in a third direction intersecting the first direction and the second direction.

10. The display device of claim 1, wherein at least one of the plurality of partition walls comprises a plurality of sub-partition walls spaced apart from each other in one direction.

11. The display device of claim 1, wherein the light path control member further comprises a light transmitting fluid which is not mixed with the light absorbing solution and is disposed inside the housing.

12. The display device of claim 11, wherein the light transmitting fluid comprises a light transmitting solution, and a difference in refractive index between the light transmitting solution and each of the plurality of partition walls is about 0.5 or less.

13. The display device of claim 12, wherein a density of the light transmitting solution is less than a density of the light absorbing solution.

14. The display device of claim 11, wherein the housing further comprises:
a first accommodating portion having a fluid connection with the channel and configured to accommodate at least a part of the light absorbing solution; and
a second accommodating portion having a fluid connection with the channel and configured to accommodate at least a part of the light transmitting fluid, and
wherein the second accommodating portion is located on an opposite side of the first accommodating portion with the channel interposed therebetween.

15. The display device of claim 11, wherein the light path control member further comprises a second fluid transfer portion configured to control flowing of the light transmitting fluid into and out of the channel.

16. The display device of claim 11, wherein the first fluid transfer portion is configured to control flowing of the light transmitting fluid into and out of the channel.

17. A display device comprising:
a display panel; and
a light path control member disposed on the display panel, wherein the light path control member comprises:
a housing comprising a plurality of partition walls and a channel defined between adjacent partition walls among the plurality of partition walls; and
a light absorbing solution configured to block transmission of light, and
wherein the light path control member is configured to charge the light absorbing solution into the channel in a first mode and discharge the light absorbing solution to an outside of the channel in a second mode different from the first mode.

18. The display device of claim 17, wherein in the first mode, the light absorbing solution filled in the channel overlaps a display area of the display panel, and
in the second mode, the light absorbing solution does not overlap the display area of the display panel.

19. The display device of claim 18, wherein the light path control member further comprises a light transmitting fluid, and
the light path control member is configured to charge the light transmitting fluid into the channel in the second mode and discharge the light transmitting fluid to the outside of the channel in the first mode.

20. The display device of claim 18, wherein the light path control member further comprises a fluid transfer portion configured to control flowing of the light absorbing solution into and out of the channel.

* * * * *